United States Patent [19]

Shankar et al.

[11] Patent Number: 5,452,229

[45] Date of Patent: Sep. 19, 1995

[54] PROGRAMMABLE INTEGRATED-CIRCUIT SWITCH

[75] Inventors: Kapil Shankar, Fremont; Mark A. Moran, San Jose, both of Calif.; Thomas J. Davies, Jr., Portland, Oreg.

[73] Assignee: Lattice Semiconductor Corporation, Santa Clara, Calif.

[21] Appl. No.: 993,711

[22] Filed: Dec. 18, 1992

[51] Int. Cl.⁶ .............................................. G06F 17/00
[52] U.S. Cl. ...................................... 364/489; 326/45
[58] Field of Search ............ 364/489, 579, 580, 929.2, 364/929.5; 371/22.2; 307/465.1, 469; 361/679, 744; 200/16 D, 16 R, 16 E; 257/175

[56] References Cited

U.S. PATENT DOCUMENTS

| | | | |
|---|---|---|---|
| 3,404,314 | 10/1968 | Warman | 361/744 |
| 3,473,160 | 10/1969 | Wahlstrom | 364/929.2 |
| 3,792,320 | 2/1974 | Hutson | 257/175 |
| 4,695,999 | 9/1987 | Lebizay . | |
| 4,766,516 | 8/1988 | Ozdemir et al. | 361/679 |
| 4,833,646 | 5/1989 | Turner . | |
| 4,855,954 | 8/1989 | Turner et al. . | |
| 5,010,445 | 4/1991 | Weinold | 361/744 |
| 5,023,775 | 6/1991 | Poret | 307/465.1 |
| 5,036,473 | 7/1991 | Butts et al. . | |
| 5,038,320 | 8/1991 | Heath et al. | 364/929.5 |
| 5,053,644 | 10/1991 | Shibata et al. | 307/465.1 |
| 5,065,276 | 11/1991 | Chou | 361/679 |
| 5,109,353 | 4/1992 | Sample et al. | 364/579 |
| 5,208,491 | 5/1993 | Ebeling et al. | 307/465.1 |
| 5,237,218 | 8/1993 | Josephson et al. | 307/465.1 |
| 5,263,149 | 11/1993 | Winlow | 364/929.2 |
| 5,317,698 | 5/1994 | Chan | 307/465.1 |

OTHER PUBLICATIONS

Dallas Semiconductor DS1223 Electronic Configurator Data Sheet (1992).
Dallas Semiconductor DS1277 8-Channel Crosspoint Switch Data Sheet (1992).
R. J. Higgins, *Electronics with Digital and Analog Integrated Circuits* (Prentice-Hall, 1983), p. 73.

Primary Examiner—Ellis B. Ramirez
Attorney, Agent, or Firm—Skjerven, Morrill, MacPherson, Franklin & Friel; Michael Shenker

[57] ABSTRACT

A non-volatile, in-system programmable integrated-circuit switch has horizontal conductive lines and vertical conductive lines. A programmable interconnect cell including a floating gate transistor is provided at each intersection of a horizontal line and a vertical line. Each line is connected to a pin through a programmable I/O cell which includes a floating gate transistor. Each I/O cell can be programmed to configure the corresponding pin as an input pin or as an inverting or non-inverting output pin. The I/O cell can also be programmed to tri-state the pin or to fix the pin at a high or low voltage level. Each input pin can be connected to more than one output pins. A TTL-to-CMOS translator in each I/O cell is provided in the output section of the cell to reduce the translator output load and make the load, and hence the speed and power consumption of the switch, less dependent on the switch programming.

34 Claims, 18 Drawing Sheets

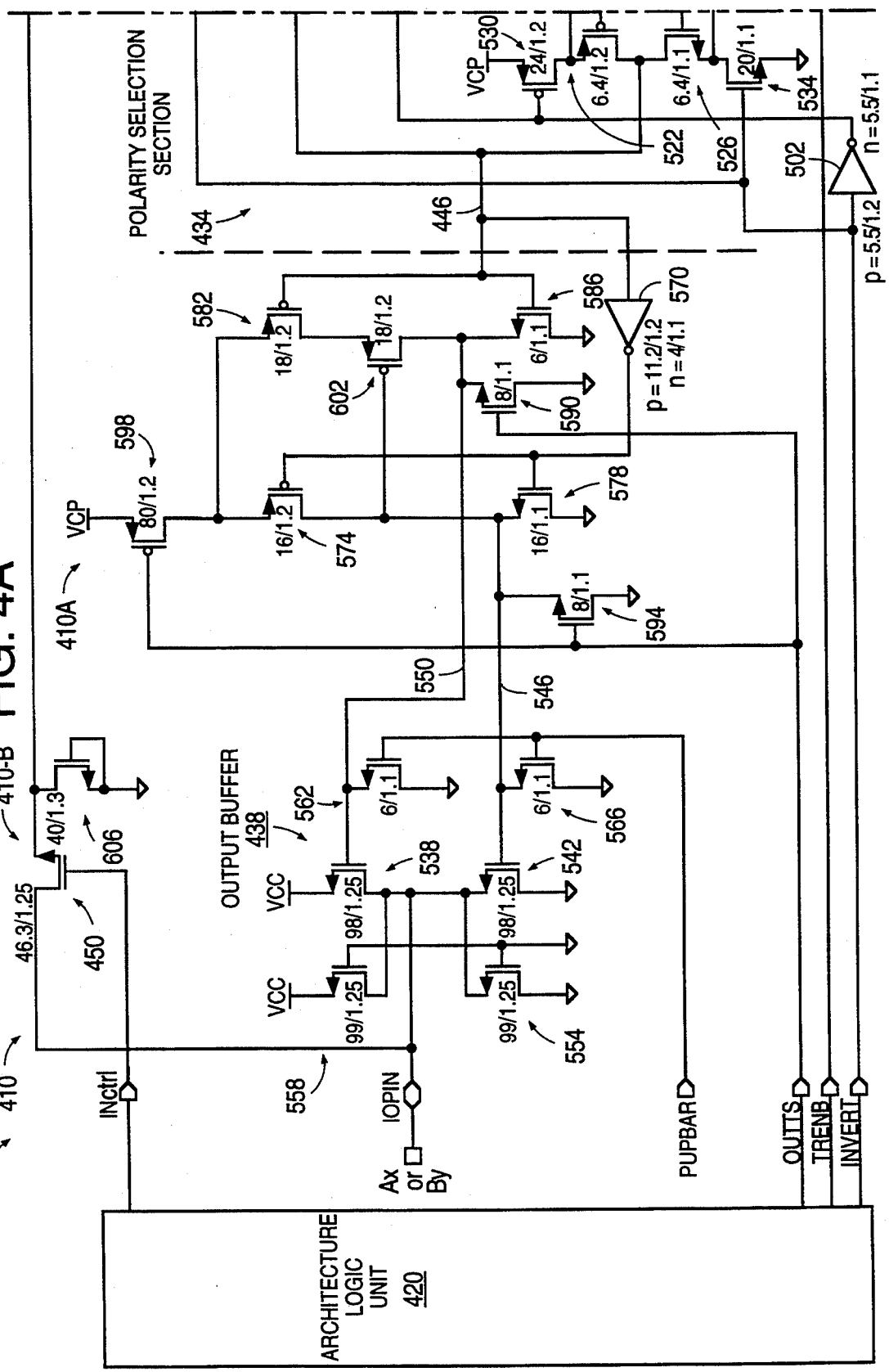

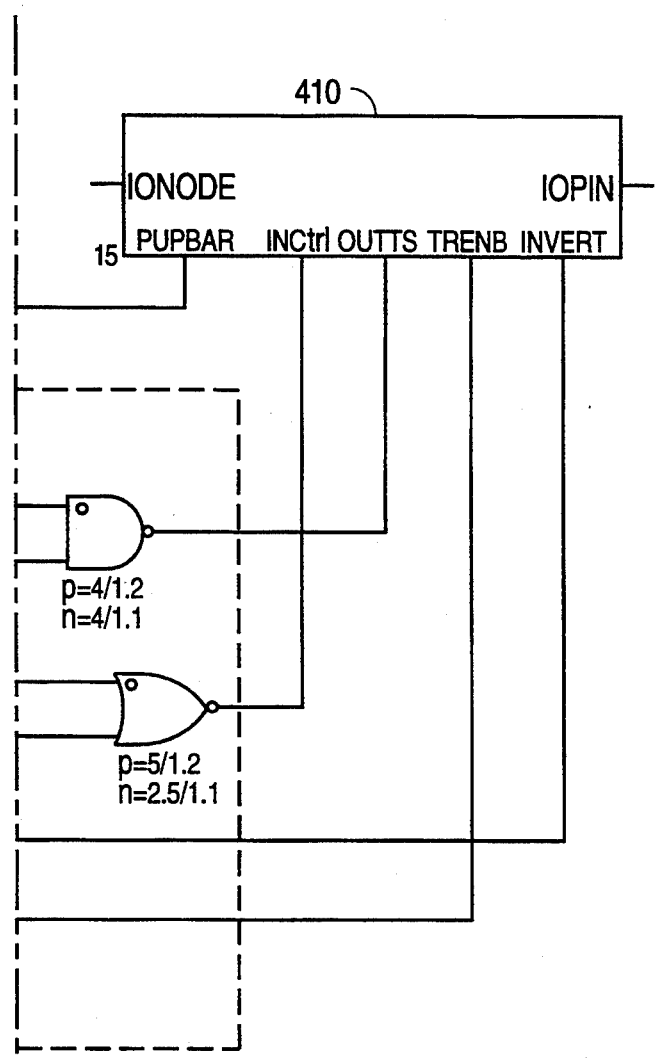
FIG. 8B
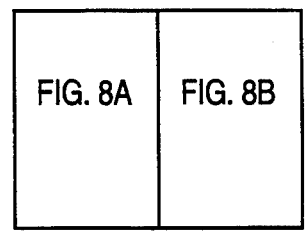

PROGRAMMABLE INTEGRATED-CIRCUIT SWITCH

BACKGROUND OF THE INVENTION

The present invention relates to interconnecting devices, and more particularly to programmable integrated-circuit switches.

Many electrical systems such as computer systems are made in different versions which differ from each other by the amount of available memory, the number and availability of peripheral devices, the address space occupied by a particular memory, for example, by a graphics controller memory, or other features.

In order to simplify the manufacturing and reduce the manufacturing costs, different versions are assembled on identical printed circuit boards and each version is configured by mechanical DIP switches (or "jumpers") that establish electrical connections appropriate for that version. A DIP switch is a piece of wire soldered into the printed circuit board to provide an electrical connection. While using identical circuit boards makes the manufacturing simpler and cheaper, the mechanical procedure of soldering the DIP switches places a limit on the speed, reliability and cost effectiveness of the manufacturing process.

In some systems, the DIP switches have been replaced by integrated circuit devices including a read-only memory (ROM) or a programmable read-only memory (PROM). A ROM is mask programmed during manufacturing, and a PROM is programmed after manufacturing by a device ("programmer") which generates a super high programming voltage to blow selected memory fuses. The memory (ROM or PROM) drives a logic which establishes electrical connections in accordance with the memory contents. The memory is programmed as appropriate for the particular version.

A disadvantage of the ROM and PROM based switches is that their versatility in establishing connections is proportional to the complexity of the memory-driven logic that establishes the connections. Moreover, the need for a programmer or for a mask-programming process to program the memory complicates the system manufacture and increases the manufacturing cost.

Thus, there is a need for a simple, versatile integrated circuit switch that can be programmed without a programmer and without a special manufacturing process such as a mask-programming process.

SUMMARY OF THE INVENTION

The present invention provides a programmable integrated circuit switch. Some embodiments of the switch are simple and versatile, and they can be programmed without a programmer or a mask-programming process.

In some embodiments, the switch has two sets of pins such that any pin of one set can be programmably connected to any pin of the other set. In some embodiments, any pin of a set of pins can be connected to any other pin of the same set. Further, in some embodiments, any pin of a set of pins can be configured as an input or an output pin. In addition, any pin can be tri-stated or fixed at a high or a low voltage level. An input pin (that is, a pin configured as an input pin) can be connected to more than one output pins.

In some embodiments, the pin connections are defined by non-volatile reprogrammable elements such as floating gate transistors. A super high programming voltage required to program the transistor is generated by the switch internally so that no programmer is required. The switch is thus in-system programmable --- it can be programmed within the system in which it is used.

The programming data can be shifted in serially from one pin in some embodiments.

In some embodiments, the versatility described above is provided by the following simple construction. The switch has two sets of conductive lines, for example, a set of horizontal lines and a set of vertical lines. A programmable interconnect cell at each intersection of a horizontal line and a vertical line programmably connects the horizontal line to the vertical line. Each conductive line is connected to a corresponding pin through a programmable I/O cell. Each I/O cell can be programmed to configure the corresponding pin as an input pin, an output pin, a tri-stated pin or a pin fixed at a high or low voltage level. The state of each interconnect cell and each I/O cell is determined by the state of a floating gate transistor of the cell.

In some embodiments, each I/O cell can be programmed to configure the corresponding pin as an inverting output pin, that is, as a pin inverting the signal on an input pin.

In some embodiments, each I/O cell has a translator which converts the cell input signal to a level suitable for the other cell components. For example, in a switch suitable for connecting TTL signals, the translator converts the TTL signals to CMOS level signals for use by other components of the I/O cell. The translators are enabled in the I/O cells programmed for output. Thus the translator translates a TTL signal on a conductive line into a CMOS signal which is processed by other components of the I/O cell, converted back to a TTL level, and provided on an output pin. The translator output load is thus limited to the other components of the same cell, and the load is therefore largely independent from how the switch is programmed. This is in contrast to a construction in which the translators are enabled in the I/O cells programmed for input. The translator output in such a construction includes the conductive lines connecting the input pin to one or more output pins. The translator load in such a construction is highly dependent on the number of the output pins connected to the input pin and hence on how the switch is programmed. In the former case in which the translator is enabled in the I/O cells programmed for output, the speed and the power consumption of the switch are less dependent on the switch programming.

Other features, embodiments and variations of the invention are described below. The invention is defined by the appended claims.

DESCRIPTION OF THE PREFERRED EMBODIMENT

Figure 1:
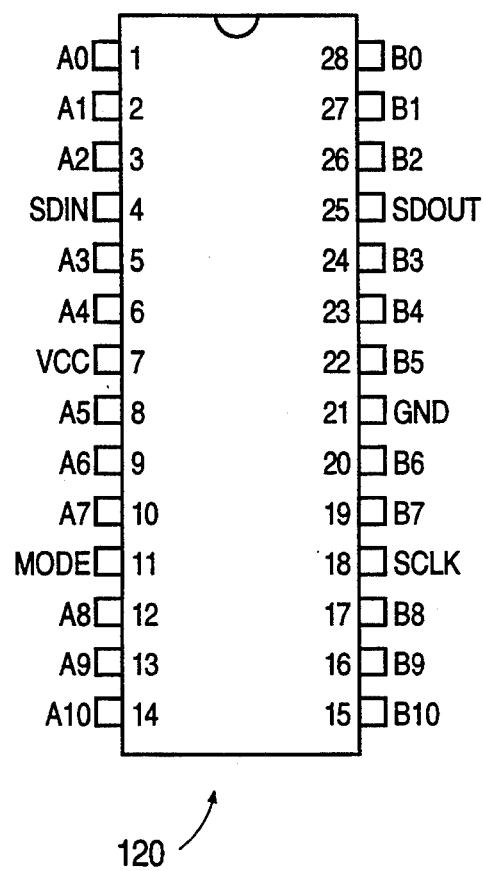
FIG. 1 is a pin-out diagram of an integrated circuit switch according to the present invention.

FIG. 1 is a pin-out diagram of an in-system programmable integrated-circuit switch 120. An example of such a switch is a switch of type ispGDS22 (Trademark) available from Lattice Semiconductor Corporation of Hillsboro, Oreg. Switch 120 can programmably connect any one of its pins A0 through A10 to any one of its pins B0 through B10. Any pin A0–A10, B0–B10 can be configured as an input pin or an output pin. An input pin can be connected to more than one output pins. An output pin can be configured to invert the input pin signal. Thus in one example, pin A1 is an input pin connected to output pins B1, B2. Pin B1 in that example is configured to invert the signal on pin A1, while pin B2 is configured not to invert the signal.

In some embodiments, any pin A0–A10, B0–B10 can be connected to any other pin A0–A10, B0–B10.

Any pin A0–A10, B0–B10 can be configured tristated or fixed at a high or low voltage level. In one embodiment, the "high" and "low" are TTL high and low levels. The TTL levels are described, for example, in R. J. Higgins, *Electronics With Digital and Analog Integrated Circuits* (Prentice-Hall, 1983) at page 73 hereby incorporated herein by reference. In other embodiments, one or more pins A0–A10, B0–B10 can be fixed at a non-TTL level such as, for example, a CMOS level.

In some embodiments, the programmable elements that define the state of switch 120 are non-volatile. In some such embodiments, the programmable elements are floating gate transistors such as used in EEPROMs (electrically erasable programmable read only memories) or EPROMs (electrically programmable read only memories). In other embodiments, the programmable elements are fuses or antifuses. In some embodiments including floating gate transistor embodiments, the switch is reprogrammable.

In some embodiments, the programmable elements are circuits or devices such as used in RAMs (random access memories).

In some embodiments, the switch is in-system programmable - - - it can be programmed without being removed from the system in which it is used. The programming voltage higher in magnitude than the power supply voltage VCC is generated from VCC by switch 120 internally.

The programming data including the programming commands are shifted in serially from pin SDIN under the control of signals on pins MODE and SCLK. The programming data can be shifted out on pin SDOUT for verification. Pin SDOUT allows cascading two or more switches. In the cascading arrangement, pin SDOUT of one switch is connected to pin SDIN of another switch. The programming data is shifted into all the cascaded switches from one pin SDIN, and the data can be shifted out for verification on one pin SDOUT. The cascaded switches can be programmed simultaneously to reduce the programming time.

Figure 2:
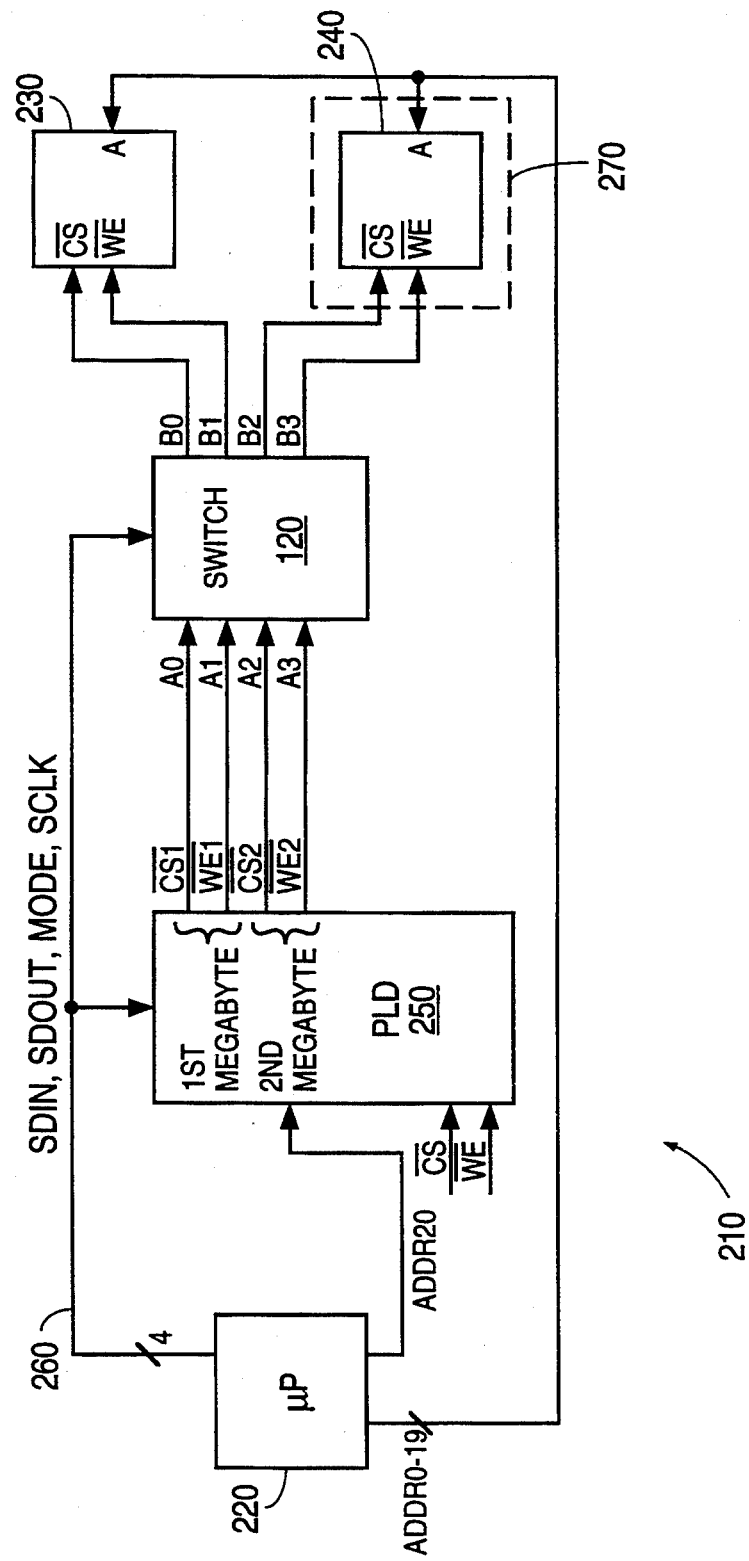
FIG. 2 is a block diagram of a system using the integrated switch of FIG. 1.

FIG. 2 illustrates an exemplary system 210 using the switch 120. Microprocessor 220 accesses one-megabyte memories 230, 240. Microprocessor address lines ADDR0-19 are connected to the address inputs of each memory. Memory chip select signal $\overline{CS}$ and write enable signal $\overline{WE}$ are inputs to programmable logic device (PLD) 250. Signals $\overline{CS}$, $\overline{WE}$ are generated by the microprocessor or by some other logic. If the microprocessor address signal ADDR20 is 0, i.e., signals ADDR0-20 address the first megabyte of the address space, PLD 250 provides its input signals $\overline{CS}$, $\overline{WE}$ on the respective outputs $\overline{CS1}$, $\overline{WE1}$. If ADDR20 is 1 pointing to the second megabyte, PLD 250 provides signals $\overline{CS}$, $\overline{WE}$ on respective outputs $\overline{CS2}$, $\overline{WE2}$. Outputs $\overline{CS1}$, $\overline{WE1}$ of PLD 250 are connected to respective pins A0, A1 of switch 120. Outputs $\overline{CS2}$, $\overline{WE2}$ are connected to pins A2, A3 of the switch. Pins B0, B1 of the switch are connected to respective inputs $\overline{CS}$, $\overline{WE}$ of memory 230, and pins B2, B3 are connected to respective inputs $\overline{CS}$, $\overline{WE}$ of memory 240. Switch 120 is programmed so that pins A0–A3 are input pins and pins B0–B3 are output pins. Switch 120 is programmed by microprocessor 220 through the four-line bus 260 connected to the switch pins SDIN, SDOUT, MODE and SCLK.

Memory 240 is part of a graphics controller 270. Some versions of system 210 expect the graphics controller memory 240 to occupy the first megabyte of the address space. In such versions, switch 120 is programmed to connect pins A0, A1 to respective pins B2, B3, and pins A2, A3 to pins B0, B1. Other versions expect memory 240 to occupy the second megabyte of the address space. Switch 120 then connects pins A0, A1 to pins B0, B1 and pins A2, A3 to pins B2, B3.

In still other versions, memory 230 is absent either logically or physically. Pins B0, B1 are then tri-stated. In other versions, pin B1 is fixed at a high voltage level to prohibit writing into memory 230.

In those embodiments in which switch 120 is reprogrammable, the same system 210 provides the functionality of different system versions. Thus, software that expects memory 240 to be in the first megabyte of the address space and software that expects memory 240 to be in the second megabyte can be executed on the same system 210. Microprocessor 220 programs switch 120 as needed before execution of each piece of software. The software that configures switch 120 is stored in some embodiments in a memory inside microprocessor 220 or in some memory (not shown) which is addressable independently of switch 120.

In some embodiments, PLD 250 is programmed through the same four-line bus 260 as used for programming switch 120. Similar commands are used for programming the switch and the PLD. In one such embodiment, switch 120 is a switch of type ispGDS22 available from Lattice Semiconductor Corporation of Hillsboro, Oreg., and PLD 250 is a PLD of type ispGAL26Z8 or ispLSI1016 also available from Lattice Semiconductor Corporation. Using the same four-line bus and similar commands for programming the switch and the PLD simplifies the system and the programming software and reduces the system size.

Figure 3:
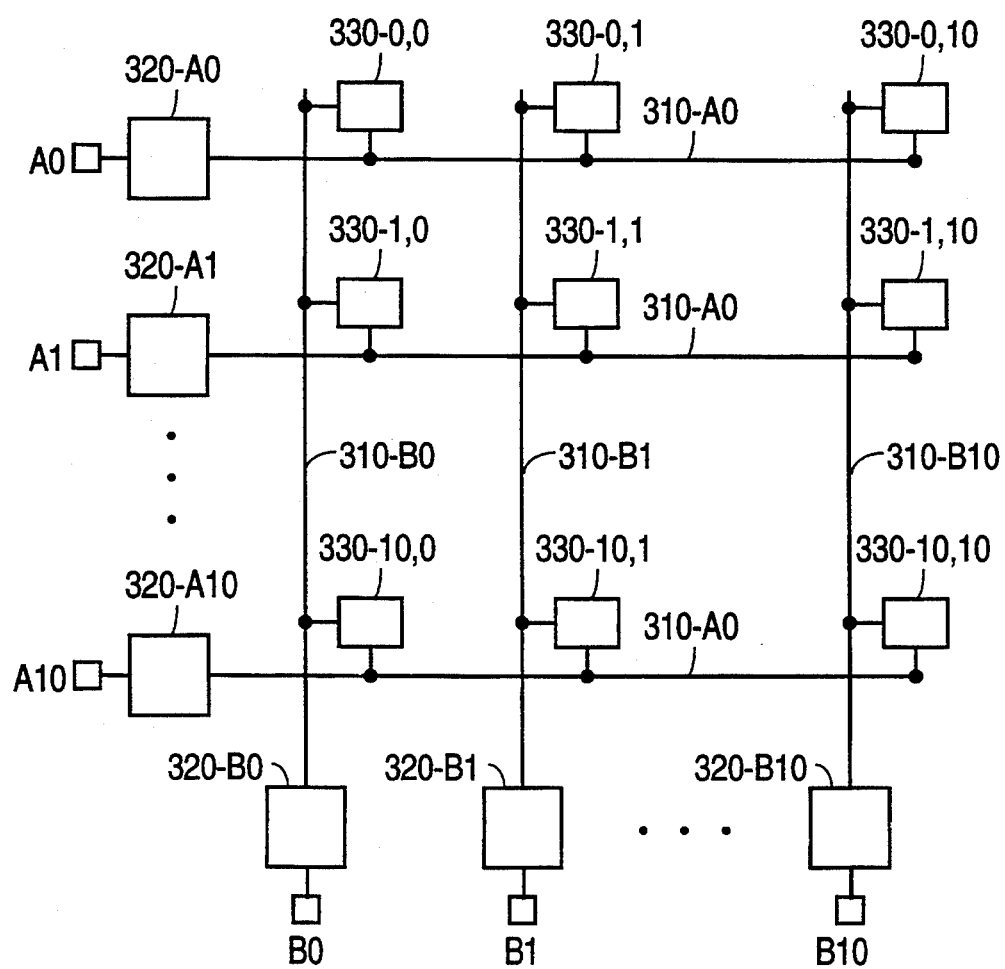
FIG. 3 is a block diagram of the switch of FIG. 1.

FIG. 3 illustrates a block diagram of switch 120. Each pin A0, . . . A10 is connected to a corresponding horizontal conductive line 310-A0, . . . 310-A10 through a corresponding programmable I/O cell 320-A0, ... 320-A10. Each pin B0, ... B10 is connected to a corresponding vertical conductive line 310-B0, ... 310-B10 through a corresponding programmable I/O cell 320-B0, ... 320-B10. Each horizontal line 310-Ax and each vertical line 310-By are interconnected by a corresponding programmable interconnect cell 330-x,y.

Pin Ax can be connected to pin By by programming the interconnect cell 330-x,y. Pin Ax can be connected to pin Ay by programming interconnect cells 330-x,i, 330-y,i for some i=0, ... 10. Pin Bx can be connected to pin By by programming interconnect cells 330-i,x, 330-i,y for some i.

Figure 4B:
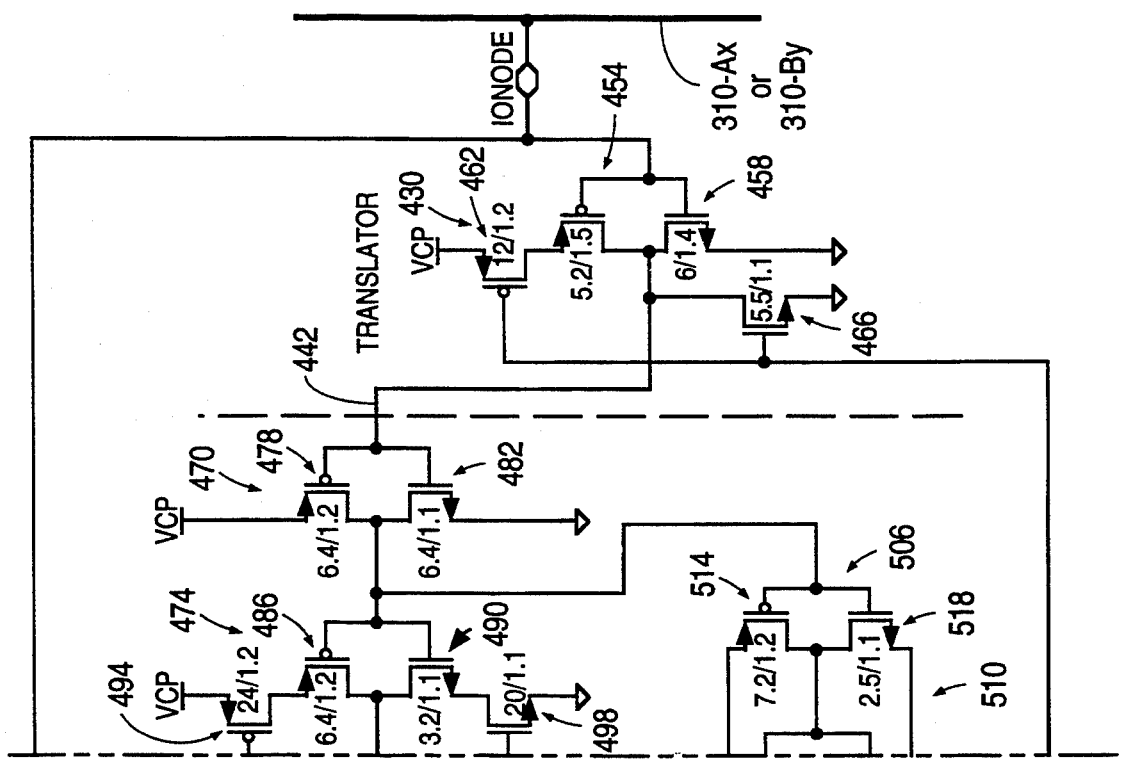
FIG. 4 is a combination block diagram and circuit diagram of an I/O cell of the switch of FIG. 1.

Each I/O cell 320-Ax, 320-By is a copy of cell 320 of FIG. 4. Cell 320 includes I/O buffer 410 and architecture logic unit 420. Terminal IONODE of buffer 410 is connected to the corresponding conductive line 310-Ax or 310-By. Terminal IOPIN is connected to the corresponding pin Ax or By.

Architecture logic unit 420, to be described in detail below, uses EEPROM technology to generate control signals INctrl, OUTTS, TRENB and INVERT for buffer 410. Table 1 below shows the states of buffer 410 for different values of the control signals. In Table 1, "TSIN TSOUT" indicates that buffer 410 tri-states the corresponding pin Ax or By. "OUT NON_INV" indicates that buffer 410 acts as a non-inverting output buffer so that the pin Ax or By provides the signal logically equivalent to the signal on the corresponding conductive line 310-Ax or 310-By. "OUT INV" indicates that the pin Ax or By is an output pin inverting the signal on the corresponding conductive line 310-Ax or 310-By. 'TTL "1"' indicates that pin Ax or By is fixed at the TTL high voltage. 'TTL "0"' indicates that the pin Ax or By is fixed at the TTL low voltage. "X" means "don't care". Signals ARbit1, ARbit2, ARbit3 are internal signals of architecture logic unit 420. These signals are described below.

another pin which is configured as an input pin. The signal from the input pin arrives at node IONODE through the input section of another I/O buffer, through conductive line 310-Ax or 310-By and through one or more other conductive lines. Depending on how the switch is programmed, the input pin may be connected to one or more other output pins. Thus the current drive on node IONODE depends on the input pin fanout. The output load of translator 430, however, consists of polarity selection section 434 and does not depend on the input pin fanout. Thus, the speed and the power consumption of translator 430 and hence of I/O buffer 410 do not depend highly on the input pin fanout. Therefore, the speed and the power consumption of switch 120 are less dependent on how the switch is programmed, as compared to buffers in which the translator is provided in the input section rather than the output section.

Translator 430 includes a CMOS inverter formed by PMOS transistor 454 and NMOS transistor 458. The gates of the two transistors are connected to node IONODE, and the drains are connected to node 442. In the drawings, the numbers, separated by a slash, near a transistor indicate the transistor channel width/length dimension in some transistor embodiments. Thus, the channel width/length dimension of transistor 454 in some embodiments is 5.2 μm/1.5 μm.

The source of transistor 458 is connected to ground. The source of transistor 454 is connected to power supply voltage VCP through PMOS transistor 462 whose gate receives translator enable signal TRENB. Voltage VCP becomes equal to the voltage on pin VCC after precharge of the switch substrate on power-up. Node 442 is connected to ground through NMOS transistor 466 whose gate receives signal TRENB. Thus the high signal TRENB disables the translator and grounds node 442.

The sizes of transistors 454, 458, 462 and 466 are

TABLE 1

| ARbit1 | ARbit2 | ARbit3 | INctrl | OUTTS | TRENB | INVERT | |
|---|---|---|---|---|---|---|---|
| 0 | 0 | 0 | 0 | 1 | 1 | X | TSIN TSOUT |
| 0 | 0 | 1 | 0 | 1 | 1 | X | TSIN TSOUT |
| 0 | 1 | 0 | 1 | 1 | 1 | X | INPUT |
| 0 | 1 | 1 | 1 | 1 | 1 | X | INPUT |
| 1 | 0 | 0 | 0 | 0 | 0 | 0 | OUT NON_INV |
| 1 | 0 | 1 | 0 | 0 | 1 | 0 | TTL "1" |
| 1 | 1 | 0 | 0 | 0 | 0 | 1 | OUT INV |
| 1 | 1 | 1 | 0 | 0 | 1 | 1 | TTL "0" |

When switch 120 is being programmed, the signals INctrl of all the I/O cells are driven to 0 and the signals OUTTS and TRENB of all the I/O cells are driven to 1 to tri-state the pins A0–A10, B0–B10.

Output section 410A of buffer 410 includes translator 430, polarity selection section 434 and output buffer 438 that are connected in series between nodes IONODE and IOPIN. Translator 430 translates a TTL level signal on node IONODE into a CMOS level signal on node 442. Polarity selection section 434 optionally inverts the signal on node 442 depending on the control signal INVERT. Output buffer 438 converts the CMOS level signal on output node 446 of polarity selection section 434 into a TTL level signal on node IOPIN.

The input section 410B of buffer 410 includes NMOS transistor 450 connected between nodes IONODE and IOPIN in parallel with output section 410A. The gate of transistor 450 receives signal INctrl.

When the pin Ax or By is configured as an output pin, buffer 410 receives a signal on node IONODE from selected to set the translator input threshold to meet the requirements of a TTL input.

Polarity selection section 434 includes CMOS inverters 470, 474 connected in series between nodes 442 and 446. Inverter 470 includes PMOS transistor 478 and NMOS transistor 482 whose gates are connected to node 442 and whose drains are connected to the inverter output. The source of transistor 482 is connected to ground, and the source of transistor 478 is connected to voltage VCP.

Inverter 474 includes PMOS transistor 486 and NMOS transistor 490 whose gates are connected to the output of inverter 470 and whose drains are connected to node 446. The source of transistor 486 is connected to voltage VCP through PMOS transistor 494 whose gate is connected to input terminal INVERT which receives signal INVERT. The source of transistor 490 is connected to ground through NMOS transistor 498 whose gate is connected to input terminal INVERT through CMOS inverter 502. The numbers next to the inverter symbols indicate the PMOS and NMOS transistor sizes of the CMOS inverter in some inverter embodiments. Thus inverter 502 has in some embodiments a PMOS transistor with a channel width/length dimension of 5.5 μm/1.2 μm and an NMOS transistor with a width/length dimension of 5.5 μm/1.1 μm. The source of the PMOS transistor of the inverter is connected to VCC, and the source of the NMOS transistor is connected to ground.

CMOS inverters 506, 510 are connected in series between the output of inverter 470 and node 446. Inverter 506 includes PMOS transistor 514 and NMOS transistor 518 whose gates are connected to the output of inverter 470. Inverter 510 includes PMOS transistor 522 and NMOS transistor 526 whose gates are connected to the drains of transistors 514, 518 and whose drains are connected to node 446. The sources of transistors 514, 522 are connected to voltage VCP through PMOS transistor 530 whose gate is connected to the output of inverter 502. The sources of transistors 518, 526 are connected to ground through NMOS transistor 534 whose gate is connected to terminal INVERT.

As is seen from the above, if the signal INVERT is low, inverters 470, 474 provide on node 446 a signal logically equivalent to the signal on node 442. As translator 430 inverts the signal on node IONODE, the signal on node 446 is a logical inverse of the signal on node IONODE.

If the signal INVERT is high, inverters 470, 506, 510 provide on node 446 a signal logically inverse of the signal on node 442 and thus logically equivalent to the signal on node IONODE.

Output buffer 438 inverts the signal on node 446 and provides a TTL level signal on node IOPIN. More particularly, node IOPIN is connected to the output of the inverter formed by NMOS transistors 538, 542. The drain of transistor 542 is connected to the source of transistor 538 and to node IOPIN. The source of transistor 542 is connected to ground. The drain of transistor 538 is connected to VCC. The gate of transistor 542 is connected to node 546 which provides the signal logically equivalent to the signal on node 446. The gate of transistor 538 is connected to node 550 which provides the signal logically inverse to the signal on node 446.

Node IOPIN is also connected to transistors 554, 558 which are always off. These transistors can be merged into respective transistors 542,538 by an appropriate mask change to increase the current drive on node IOPIN if needed.

NMOS transistors 562, 566 connect respective nodes 550, 546 to ground. The gates of the two transistors are connected to input terminal PUPBAR. Input terminal PUPBAR is driven high on power-up so as to ground the nodes 550, 546 and thus prevent buffer 438 from driving the node IOPIN. Except during power-up, input PUPBAR is low and transistors 562, 566 are off.

Nodes 550, 546 are connected to node 446 as follows. Node 446 is connected to the input of CMOS inverter 570. The output of inverter 570 is connected to the gates of PMOS transistor 574 and NMOS transistor 578 which transistors form a CMOS inverter. The drains of transistors 574, 578 are connected to node 546. The source of transistor 578 is connected to ground.

Node 446 is connected also to the gates of PMOS transistor 582 and NMOS transistor 586 which transistors form a CMOS inverter. The source of transistor 586 is connected to ground. The drain of transistor 586 is connected to node 550.

Nodes 550, 546 are connected to ground through respective NMOS transistors 590, 594 whose gates receive the output-tri-state signal OUTTS. Signal OUTTS is also delivered to the gate of PMOS transistor 598 which connects the sources of transistors 574, 582 to voltage VCP. The high signal OUTTS grounds nodes 550, 546 to prevent buffer 438 from driving the node IOPIN.

When signal OUTTS is low, the output signal on node IOPIN is logically equivalent or logically inverse to the signal on node 442 depending on the signal INVERT. If signal TRENB is low enabling translator 430, the signal on node 442 is a logical inverse of the signal on node IONODE. If signal TRENB is high, the signal on node 442 is a ground voltage, and node IOPIN is fixed at TTL high or low depending on the signal INVERT.

PMOS transistor 602 connected between the drains of transistors 582 and 586 delays turning on transistor 538 on high-to-low transitions of the voltage on node 446. More particularly, the source of transistor 602 is connected to node 550. A feedback path connects the gate of transistor 602 to node 546. On a high-to-low transition of the signal on node 446, the low-to-high transition of the voltage on node 550 is delayed until the voltage on node 546 becomes sufficiently low to turn on transistor 602. Thus the impedance of transistor 542 increases before the impedance of transistor 538 starts decreasing. As a result, the power consumption is reduced on the low-to-high transitions of the signal on node IOPIN.

In some embodiments, transistor 602 is omitted, and the drain of transistor 582 is connected directly to the drain of transistor 586. The power consumption is increased in some such embodiments, but the speed is improved because of faster transitions of the voltage on node 550.

Normally-off NMOS transistor 606 provides electrostatic discharge protection. The source and the gate of transistor 606 are connected to ground, and the drain is connected to node IONODE.

Figure 5:
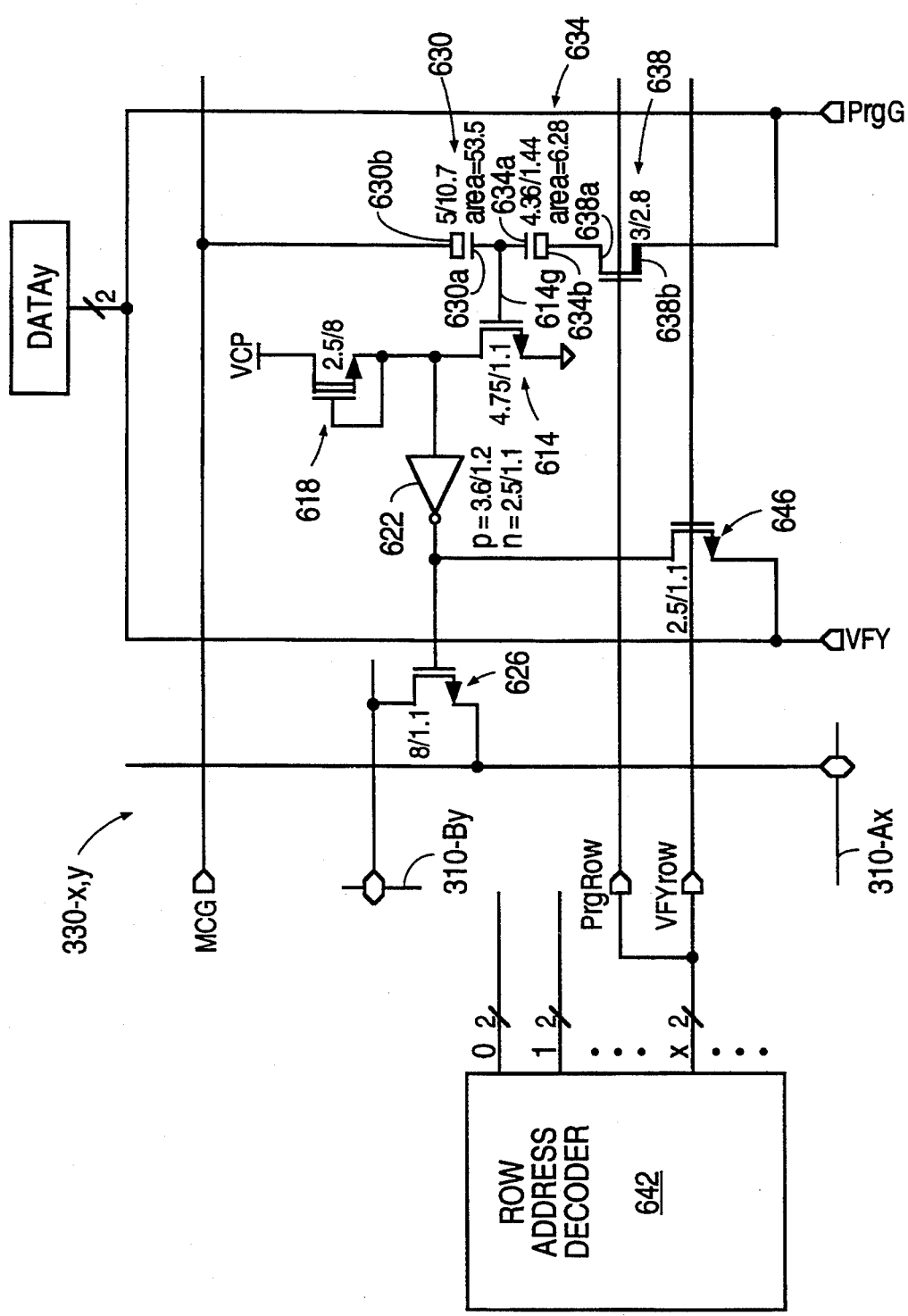
FIG. 5 illustrates a circuit diagram of an interconnect cell of the switch of FIG. 1.

FIG. 5 illustrates a circuit diagram of interconnect cell 330-x,y where x,y=0, 1, ..., 10. The state of cell 330-x,y is determined by the state of floating gate transistor 614. The source of transistor 614 is connected to ground. The drain is connected to the source and the gate of depletion transistor 618 whose drain is connected to voltage VCP.

The drain of transistor 614 is connected also to the input of CMOS inverter 622 whose output is connected to the gate of NMOS transistor 626. One source/drain electrode of transistor 626 is connected to conductive line 310-Ax. The other source/drain electrode is connected to conductive line 310-By. If transistor 614 is in a conductive ("programmed") state, transistor 626 conducts electrically connecting line 310-By to line 310-AX. If transistor 614 is in a non-conductive state, transistor 626 is also non-conductive, electrically disconnecting line 310-By from line 310-Ax.

In one embodiment, transistor 614 is of the type described in the U.S. patent application Ser. No. 07/777,769 filed Oct. 15, 1991 by G. R. Josephson et al. and entitled "SINGLE POLY EE CELL WITH SEPARATE READ/WRITE PATHS AND REDUCED PRODUCT TERM COUPLING" (now U.S. Pat. No. 5,331,590 issued Jul. 19, 1994) which is hereby incorporated herein by reference. Floating gate 614g of transistor 614 is connected to electrode 630a of capacitor 630 and to electrode 634a of capacitor 634. The numbers, separated by a slash, next to each capacitor indicate the capacitor width/length dimension in some capacitor embodiments. Thus the width/length dimension of capacitor 630 in some embodiments is 5 μm/10.7 μm providing the capacitor area of 5 * 10.7=53.5 μm².

The other electrode 630b of capacitor 630 serves as a control gate of transistor 614. Electrode 630b is provided with a tunnel implant region described in the aforementioned U.S. patent application Ser. No. 07/777,769. Electrode 630b is connected to terminal MCG which is connected in a similar fashion to all the interconnect cells 310-i,j.

Transistor 614 is programmed or erased through capacitor 634 by means of Fowler Nordheim tunnelling as described in the aforementioned U.S. patent application Ser. No. 07/777,769 (now U.S. Pat. No. 5,331,590) Electrode 634b of capacitor 634 is provided with a tunnel implant region and a tunnel oxide region which are described in that patent application. Electrode 634b is connected to source/drain electrode 638a of write select NMOS transistor 638. The gate of transistor 638 is connected to line PrgRow which is connected in a similar fashion to all the interconnect cells 310-x,j of row "x", j=0, ..., 10. Source/drain electrode 638b of transistor 638 is connected to line PrgG which is connected in a similar fashion to all the interconnect cells 310-i,y of column "y", i=0, ..., 10. Electrode 638b is illustrated in FIG. 5 by a thick line which indicates that the electrode includes a high voltage implant described in the aforementioned U.S. patent application Ser. No. 07/777,769 (now U.S. Pat. No. 5,331,590).

The voltages applied in some embodiments to the terminals of the interconnect cell for performing the Erase, Program, Verify and Normal functions are shown in Table 2 below. "Vtn" in Table 2 stands for the threshold voltage of an NMOS transistor such as transistor 626. "Vpp" stands for the programming voltage. In one embodiment in which Vcc=5.0 V, Vtn=1.0 V and Vpp=14.5 V.

TABLE 2

| | Erase | Program | Verify | Normal |
|---|---|---|---|---|
| Prg-Row | Vcc − 2Vtn | Vpp + Vtn | Vcc − 2Vtn | Vcc − 2Vtn |
| PrgG | 0 | Vpp | 0 | 0 |
| MCG | Vpp | −Vtn | Vtn | Vtn |
| VFY-row | 0 | 0 | Vcc | 0 |
| VFY | 0 | 0 | 0 | 0 |

The line PrgRow of each row "x" is connected to row address decoder 642 which receives a row address from pin SDIN (FIG. 1) as described below. Line PrgG of each column "y" is connected to shift register latch (SRL) DATAy (one of shift register latches DATA0 through DATA10) which also receives data from pin SDIN. The programming circuitry operates on one or more rows of interconnect cells 330-x,y simultaneously when the decoder 642 asserts proper signals on lines PrgRow and the SRLs DATAy supply appropriate data. In some embodiments, in order to program selected interconnect cells, all the cells of one or more rows are erased, and then the selected cells are programmed. In other embodiments, all the cells of one or more rows are programmed, and then the selected cells are erased. In still other embodiments, both programming methods - - - bulk erasing followed by selective programming and bulk programming followed by selective erasing - - - are available.

Read select NMOS transistor 646 connects the output of inverter 622 to line VFY. Line VFY is connected in a similar fashion to all the interconnect cells of column "y". Line VFY of column "y" is connected to SRL DATAy.

The gate of transistor 646 is connected to line VFY-row. Line VFYrow is connected in a similar fashion to all the interconnect cells of column "x". Lines VFYrow and PrgRow of row "x" are connected to a two-line output of decoder 642 which output is labeled "x" in FIG. 5. To verify the state of interconnect cells 310-x,j of row "x", j=0, ... 10, decoder 642 raises line VFY-row of row "x" high thus turning on the row read select transistors. The output signals from the inverters such as inverter 622 are then written into SRLs DATAy from where they are shifted out to pin SDO.

In one embodiment, depletion transistor 618 is replaced by a PMOS transistor whose source is connected to voltage VCP, whose drain is connected to the drain of transistor 614, and whose gate is connected to floating gate 614g.

Figure 6:
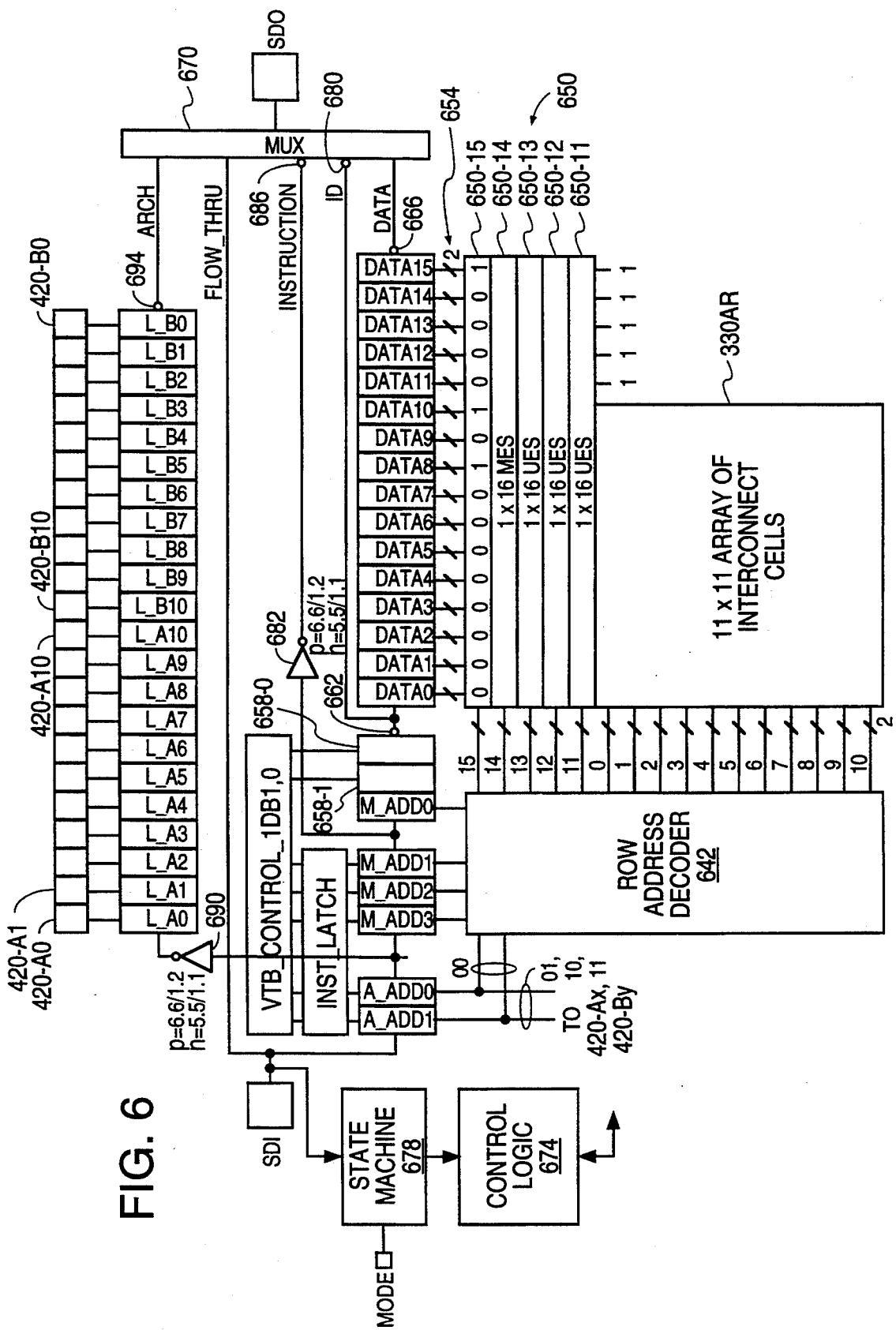
FIG. 6 is a block diagram of the programming circuitry of switch of FIG. 1.

FIG. 6 is a block diagram of the programming logic that programs interconnect cells 330-x,y and I/O cells 320-Ax, 320-By. Row address decoder 642 has eleven two-line outputs, marked 0 through 10, for controlling the array 330AR of interconnect cells 330-x,y. Each output 0 through 10 includes lines PrgRow and VFY-row (FIG. 5).

Row address decoder 642 has also two-line outputs 11 through 14 for selecting the respective rows 650-11 through 650-14 of memory 650. Decoder 642 has a one-line output 15 for selecting row 650-15 for reading. Each row 650-11 through 650-14 includes sixteen EEPROM locations. Rows 650-11, 650-12 and 650-13 are user programmable. Row 650-14 is programmable in manufacturing mode only. Row 650-15 is programmed during manufacturing to contain the binary number 0000000010100001.

Each SRL DATA0 through DATA15 has an output line PrgG and an input line VFY (FIG. 5). Lines PrgG, VFY are shown collectively at 654. Lines PrgG, VFY of each SRL DATAy, y=0, ..., 10 are connected to one column of interconnect cell array 330AR as shown in FIG. 5. Lines PrgG, VFY of each SRL DATAy, y=0, ..., 15 are also connected to column "y" of memory 650. The memory locations are written through respective lines PrgG and read through respective lines VFY. During reading of interconnect cell array 330AR, SRLs DATA11 through DATA15 are loaded with logic "1".

SRLs DATA0 through DATA15 are connected into a shift register which includes also SRLs A_ADD1, A_ADD0, M_ADD3 through M_ADD0, 658-1 and 658-0. The input of SRL A_ADD1 is connected to pin SDI. SRL 658-0 is connected to SRL DATA0 through CMOS inverter 662 whose input is connected to the output of SRL 658-0 and whose output is connected to the input of SRL DATA0. In some embodiments, the p channel width/length dimension of inverter 662 is 5.5 μm/1.2 μm and the n channel width/length dimension is 5.5 μm/1.1 μm. The output of SRL DATA15 is connected to the input of CMOS inverter 666 whose output is connected to an input of multiplexer 670. In some embodiments, the p channel width/length dimension of inverter 666 is 5.5 μm/1.2 μm and the n channel width-/length dimension is 5.5 μm/1.1 μm.

The output of multiplexer 670 is connected to pin SDO. Multiplexer 670 is controlled by control logic 674.

The operation of the programming logic is controlled by five-bit commands (also termed "instructions") which are decoded and executed by logic 674. The commands are shifted in from pin SDI into the five SRLs A_ADD1 through M_ADD1. The commands are shifted in and executed under the control of state machine 678. One embodiment of state machine 678 is described in the U.S. patent application Ser. No. 07/695,356 filed May 3, 1991 by G. R. Josephson et al. and entitled "STRUCTURE AND METHOD FOR MULTIPLEXING PINS FOR IN-SYSTEM PROGRAMMING" (now U.S. Pat. No. 5,237,218 issued Aug. 17, 1993) which is hereby incorporated herein by reference.

Figure 7:
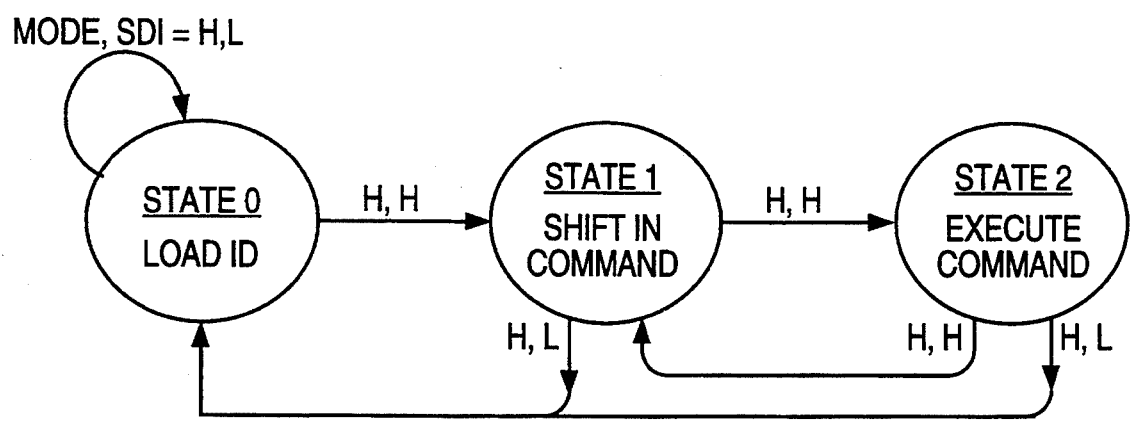
FIG. 7 is a state diagram of a state machine of the circuitry of FIG. 6.

The state diagram of state machine 678 is illustrated in FIG. 7. State machine 678 is controlled by signals on pins MODE, SDI, SCLK. Initial state 0 is entered when the switch is clocked by the clock on pin SCLK with MODE high and SDI low. In state 0, an internal ID is loaded into the eight SRLs A_ADD1 through 658-0 and shifted out to pin SDO through inverter 662, the "ID" line, CMOS inverter 680 and multiplexer 670 for verification.

The remaining functions of the programming logic are performed in states 1 and 2. In state 1, a command is shifted into the SRLs A_ADD1 through M_ADD1. In state 2, the command is executed.

The commands in one embodiment are illustrated in Table 3 below. The first five columns of Table 3 show the five-bit command code. A "1" in column "MNFG" indicates that the command is available only in manufacturing mode. The manufacturing mode is entered by applying a super high voltage to one of the pins. In manufacturing mode, two other pins are assigned special functions: "BP" (bulk program) and "VTE" (voltage trim enable). A value "1" or "0" in column "BP" or "VTE" indicates the value of the corresponding pin in manufacturing mode. A blank in column "BP" or "VTE" indicates that the value of the corresponding pin is "don't care".

TABLE 3

| A A D D 1 | M A D D 1 | M N F G | B P | V T E | COMMAND NAME | DESCRIPTION |
|---|---|---|---|---|---|---|
| 0 0 0 1 0 | | | | | SHIFT | shift data and/or address |
| 0 0 1 1 1 | | | | | PROG | A_ADD1,0 = 01,10,11 program corresponding I/O ARCH ARRAY bits A_ADD1,0 = 00 program interconnect cell array or memory except 650-14,15 |
| 0 0 1 1 1 | | 1 | | | VTBPROG | Program VTB Bits and IDB0, IDB1 |
| 0 0 1 1 1 | | 1 | | | VTBCLR | Erase VTB Bits and IDB0, IDB1 |
| 0 1 0 1 0 | | | | | VERIFY | A_ADD1,0 = 01,10,11 read corresponding I/O ARCH ARRAY bits A_ADD1,0 = 00 read SW or MEM array inclusive MES |
| 0 0 0 1 1 | | | | | GBE | Global Bulk Erase except for MES |
| 0 0 0 1 1 | | 1 | 1 | | GBP | Global Bulk Program except for MES |
| 0 0 1 1 0 | | | | | ARCHBE | Arch Bulk Erase |
| 0 0 1 1 0 | | 1 | 1 | | ARCHBP | Arch Bulk Program |
| 0 0 1 0 1 | | | | | ARRAYBE | Array Bulk Erase |
| 0 0 1 0 1 | | 1 | 1 | | ARRAYBP | Array Bulk Program |
| 1 0 0 0 0 | | 1 | 0 | | ERAALL | Erase All |
| 1 0 0 0 0 | | 1 | 1 | | PROGALL | Program All |
| 0 0 0 0 0 | | | | | NOP | No Operation (remain idle) |
| 0 1 1 1 0 | | | | | FLOWTHRU | SDI Direct to SDO |

The programming logic operates as follows. In state 1, a command is shifted into SRLs A_ADD1 through M_ADD1. SRLs A_ADD1 through M_ADD0 are clocked by clock MSCLK (not shown in FIG. 6). SRLs 658-1 through DATA15 are clocked by a separate clock MSCLKAR (not shown in FIG. 6). Both clocks are derived from the clock signal on pin SCLK (FIG. 1). The use of separate clocks allows shifting in the command without destroying the contents of SRLs 658-1 through DATA15 as the clock MSCLKAR is inactive when the command is shifted in.

To program cells of a row of array 330AR or of memory 650, command SHIFT is shifted in in state 1. In state 2, the command is executed to shift the appropriate programming data into SRLs DATA0 through DATA15, to shift the row address into SRLs M_ADD3 through M_ADD0, and to shift "00" into A_ADD1,0. Then the state machine returns to state 1, and the command PROG is shifted into SRLs A_ADD1 through M_ADD1. Before this shift, the row address in SRLs M_ADD3 through M_ADD0 is latched into row address decoder 642. In state 2, the PROG command is executed to program the interconnect cells or the memory.

To verify a row of interconnect cells or the memory, a command SHIFT is shifted in in state 1, and then in state 2 the row address is shifted into SRLs M_ADD3 through M_ADD0. "00" is shifted into A_ADD1,0. Then in state 1 the command VERIFY is shifted in. In state 2, the command is executed to transfer the contents of the addressed row to SRLs DATA0 through DATA15. Then command SHIFT is shifted in and executed to shift out the latches' contents to pins SDO.

When the command SHIFT is executed in state 2, the data are shifted at the same time into SRLs M_ADD3 through DATA15 and, in parallel, into SRLs L_A0 through L_B0. The data in SRLs L_A0 through L_B0 are used to program the architecture logic units 420-A0 through 420-B0 as described below. The architecture logic units generate control signals for the I/O cells. The first two bits of data shifted into the SRLs A_ADD1, A_ADD0 during execution of the SHIFT command preceding the PROG or VERIFY command indicate whether the PROG or VERIFY command will operate on array 330AR and memory 650 or on the I/O cells. SRLs A_ADD1, A_ADD0 are connected to row address decoder 642 and to architecture logic units 420. If the two bits in the SRLs A_ADD1, A_ADD0 are "00" decoder 642 will activate its outputs during the PROG or VERIFY command execution so that the PROG or VERIFY command will operate on array 330AR or memory 650. Architecture logic units 420 will not be operated on. If the value in SRLs A—ADD1, A—ADD0 is "01" "10" or "11" decoder 642 will not activate its outputs but the PROG or VERIFY command will operate on the architecture logic units 420 as described below.

Five-bit register INST—LATCH latches the command before transferring it to control logic 674. Logic 674 which includes a programmable logic device (not shown) decodes and executes the commands using methods well known in the art.

Five bits of seven-bit register VTB—CONTROL—IDB1,0 which are connected to respective SRLs A—ADD1 through M—ADD1 are written in the manufacturing mode with a value that defines the programming voltage VPP. Switch 120 includes a voltage divider which allows the VPP value to be defined in the manufacturing mode.

Two bits of register VTB—CONTROL—IDB1,0 which are connected to respective SRLs 658-1,0 contain two bits of the internal ID. The six remaining ID bits are stored elsewhere using techniques known in the art.

The INSTRUCTION line allows shifting out the instruction through CMOS inverters 682, 686 for verification. The previous instruction is shifted out in state 1 as the new instruction is shifted in.

The FLOW—THRU line allows shifting out data from pin SDI directly through multiplexer 670 to pin SDO.

The output of SRL A—ADD0 is connected to the input of CMOS inverter 690 whose output is connected to the input of shift register latch L—A0. SRLs A—ADD1,0, L—A0 through L—A10, L—B10 through L—B0 form a shift register that holds data for programming I/O cells 320-Ax, 320-By. The output of SRL L—B0 is connected to the input of CMOS inverter 694 whose output is connected to an input of multiplexer 670.

Figure 8A:
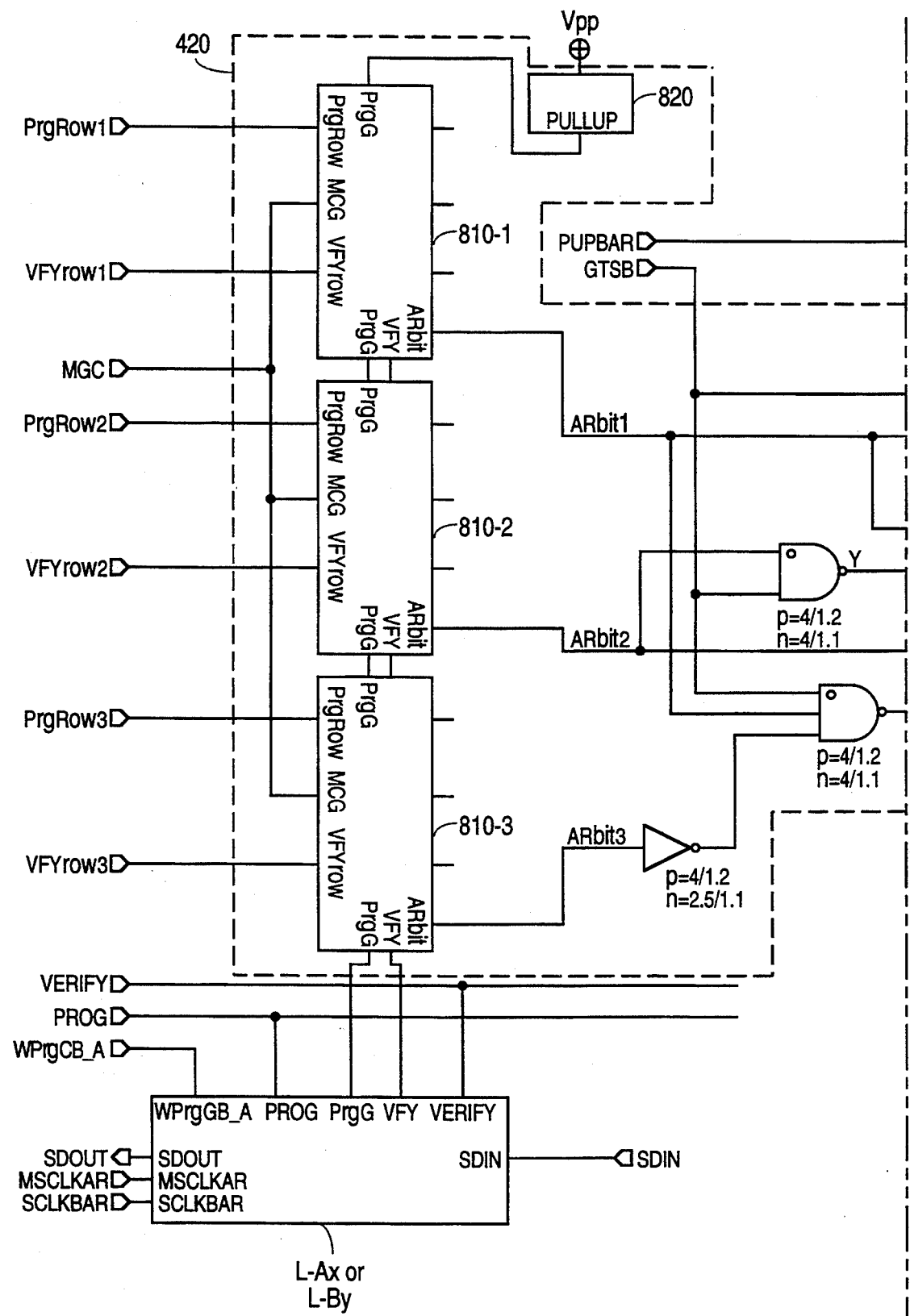
FIG. 8 illustrates a combination block diagram and circuit diagram of the I/O cell of the switch of FIG. 1.
Figure 9:
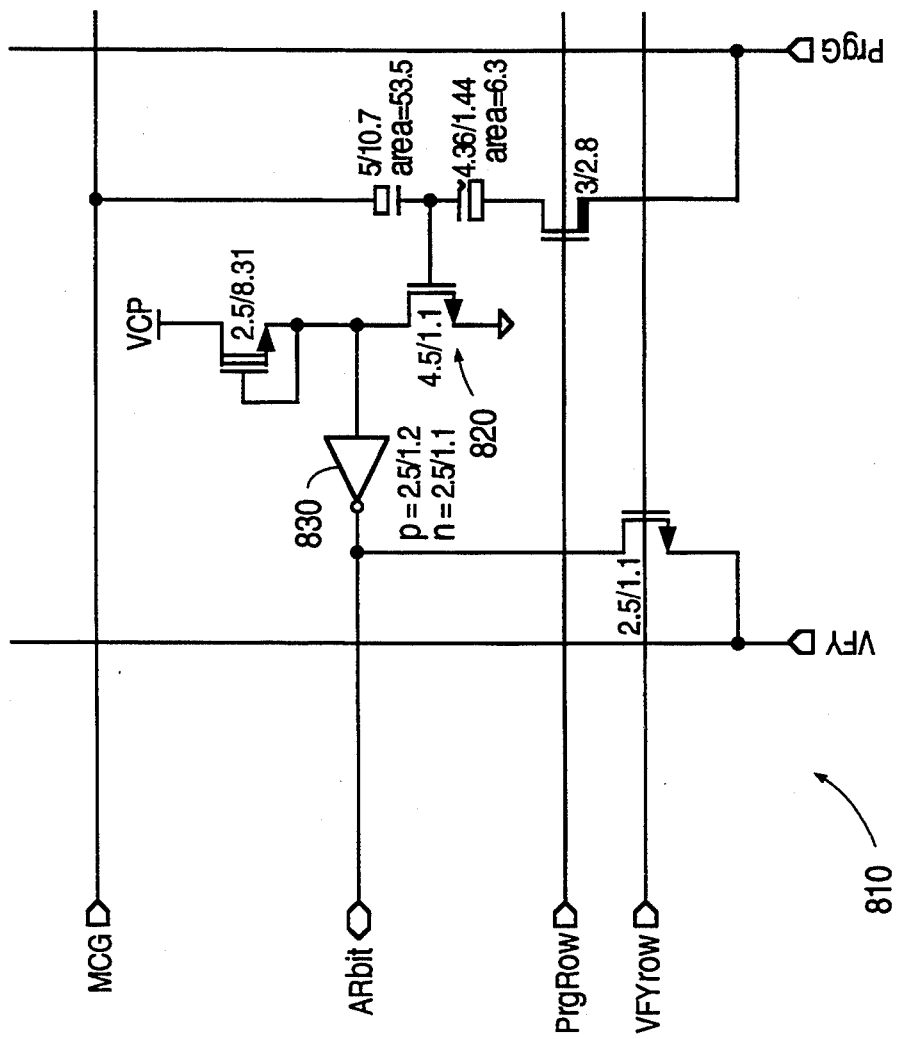
FIG. 9 is a circuit diagram of a portion of the I/O cell of FIG. 8.

The output of each SRL L—Ax or L—By is connected respectively to an input of architecture logic unit 420-Ax or 420-By which generates control signals for the I/O buffer 410 (FIG. 4) of the respective I/O cell 320-Ax or 320-By. Each architecture logic unit 420-Ax, 420-By is a copy of unit 420 of FIG. 4. A diagram of architecture logic unit 420 is illustrated in FIG. 8. Each architecture logic unit 420 has three architecture logic cells 810-1, 810-2, 810-3. Each architecture logic cell is a copy of architecture logic cell 810 of FIG. 9. Each architecture logic cell 810 includes a floating gate transistor 820. Architecture logic cell 810 is similar to interconnect cell 330-x,y of FIG. 5 except that the output of inverter 830 of FIG. 9, which inverter is similar to inverter 622 of FIG. 5, is connected to terminal ARbit of cell 810.

Terminals ARbit of cells 810-i provide signals ARbit1, ARbit2, ARbit3 which determine the control signals of the respective input buffer 410 as shown above in Table 1. More particularly, control signal OUTTS is a NAND of signals ARbit1 and GTSB. Signal GTSB is described below. Signal INctrl is a NOR of ARbit1 and of a NAND of GTSB and ARbit2. TRENB is a NAND of GTSB, ARbit1 and the inverse of ARbit3. INVERT is Arbit2.

Signal GTSB is high in normal operation. When the switch is being programmed, signal GTSB is driven low to tri-state the pins A0-A10, B0-B10.

The voltages applied to the terminals of cell 810 for performing the Erase, Program, Verify and Normal functions are shown in Table 2 above.

Terminals PrgG of cells 810-1, 810-2, 810-3 are connected to output PrgG of the respective SRL L-Ax or L-By. Terminals VFY of the three cells are connected to input VFY of the respective SRL.

Input terminals PrgRow of the cells 810-1 of all the architecture logic units are connected to terminal PrgRow1 which is connected to control logic 674 (FIG. 6). Terminals PrgRow of all the cells 810-2 are connected to terminal PrgRow2 which is connected to logic 674. Terminals PrgRow of all the cells 810-3 are connected to terminal PrgRow3 which is connected to logic 674. During programming of I/O cells 320-Ax, 320-By by command PROG (Table 3), logic 674 asserts a high voltage signal on one of the three terminals PrgRow1, PrgRow2, PrgRow3 depending on the value of the command bits A—ADD1,0 in respective SRLs A—ADD1,0. See the PROG command description in Table 3 above If the value of bits A ADD1,0 is "01" the terminal PrgRow1 is driven high allowing programming of cells 810-1. If the value of command bits A—ADD1,0 is "10" terminal PrgRow2 is driven high If the value is "11" terminal PrgRow3 is driven high If the value is "00" terminals PrgRow1, PrgRow2, PrgRow3 are kept low and the PROG command operates on memory 650 or the interconnect cell array 330AR.

When the cells 810-i are erased or programmed, the programming signals are supplied on terminals PrgG of the respective latches L-Ax, L-By and on the global terminal MCG. Thus all the cells 810-1 can be erased or programmed simultaneously, and any selected set of cells 810-1 can be erased or programmed simultaneously. The same is true for cells 810-2 and 810-3.

Pullup circuit 820 provides a programming voltage to cells 810-i as described below. Terminal PULLUP of circuit 820 is connected to the lines PrgG of all the three cells 810-i and to the output PrgG of the respective SRL L-Ax or L-By.

Figure 10:
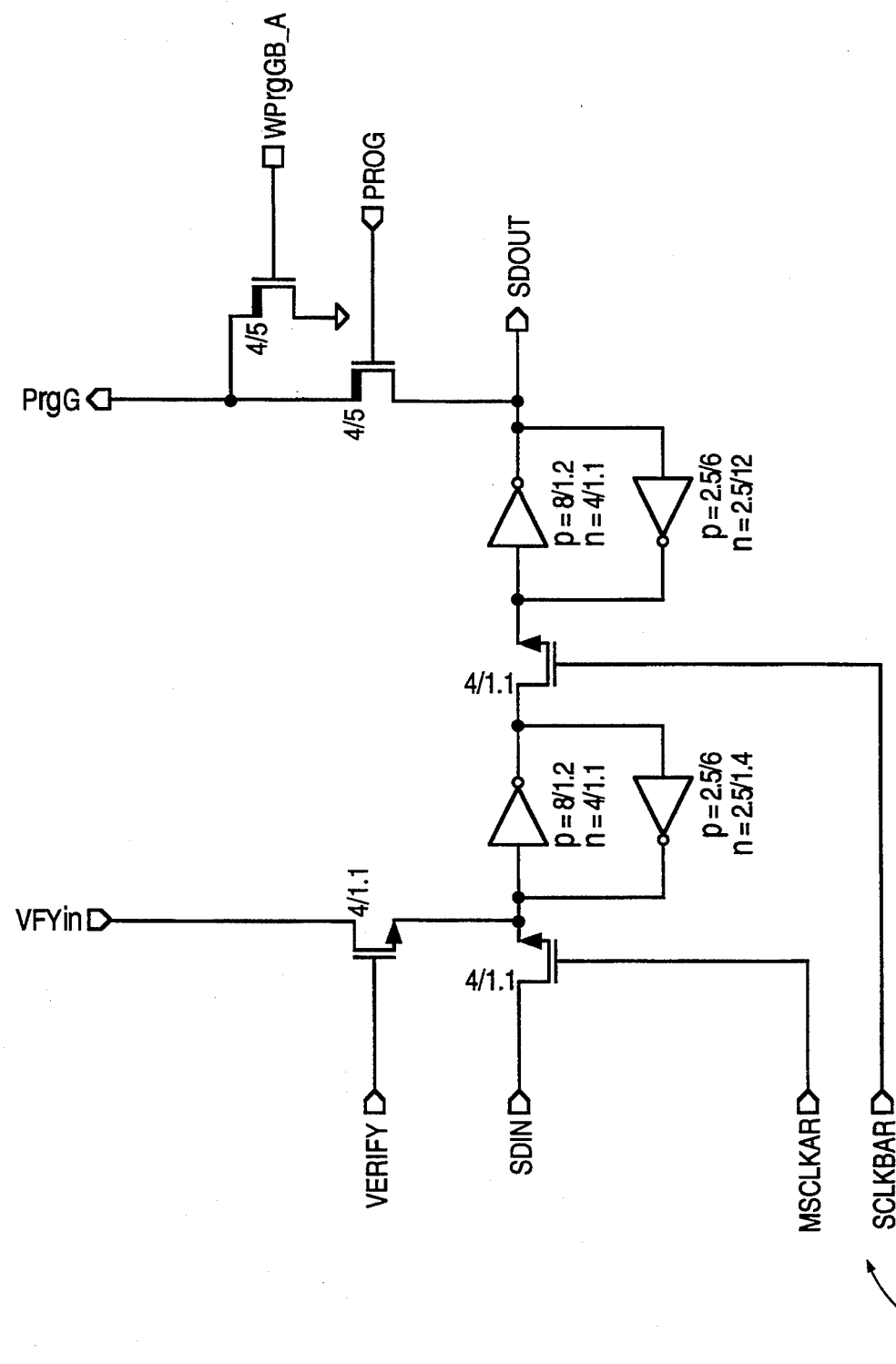
FIGS. 10–14 are circuit diagrams of shift register latches of the programming circuitry of FIG. 6.

Each SRL L-Ax, L-By has a circuit diagram of FIG. 10. The SRLs are clocked by clock MSCLKAR. Thus the command is shifted in in state 1 without disturbing the data in SRLs L-Ax, L-By.

Clock SCLKBAR is the inverse of clock MSCLK.

When the command PROG is being executed, the signal PROG (FIGS. 8, 10) becomes high to allow programming the architecture logic cells. When the command VERIFY is being executed, the signal VERIFY becomes high to allow the SRLs L-Ax, L-By to latch the signals from the architecture logic cells.

When signal PROG is low, signal WPrgGB—A is high to ground the terminal PrgG and thus to keep it from floating. WPrgGB—A is high also when the architecture logic cells 810-i are erased.

Figure 11:
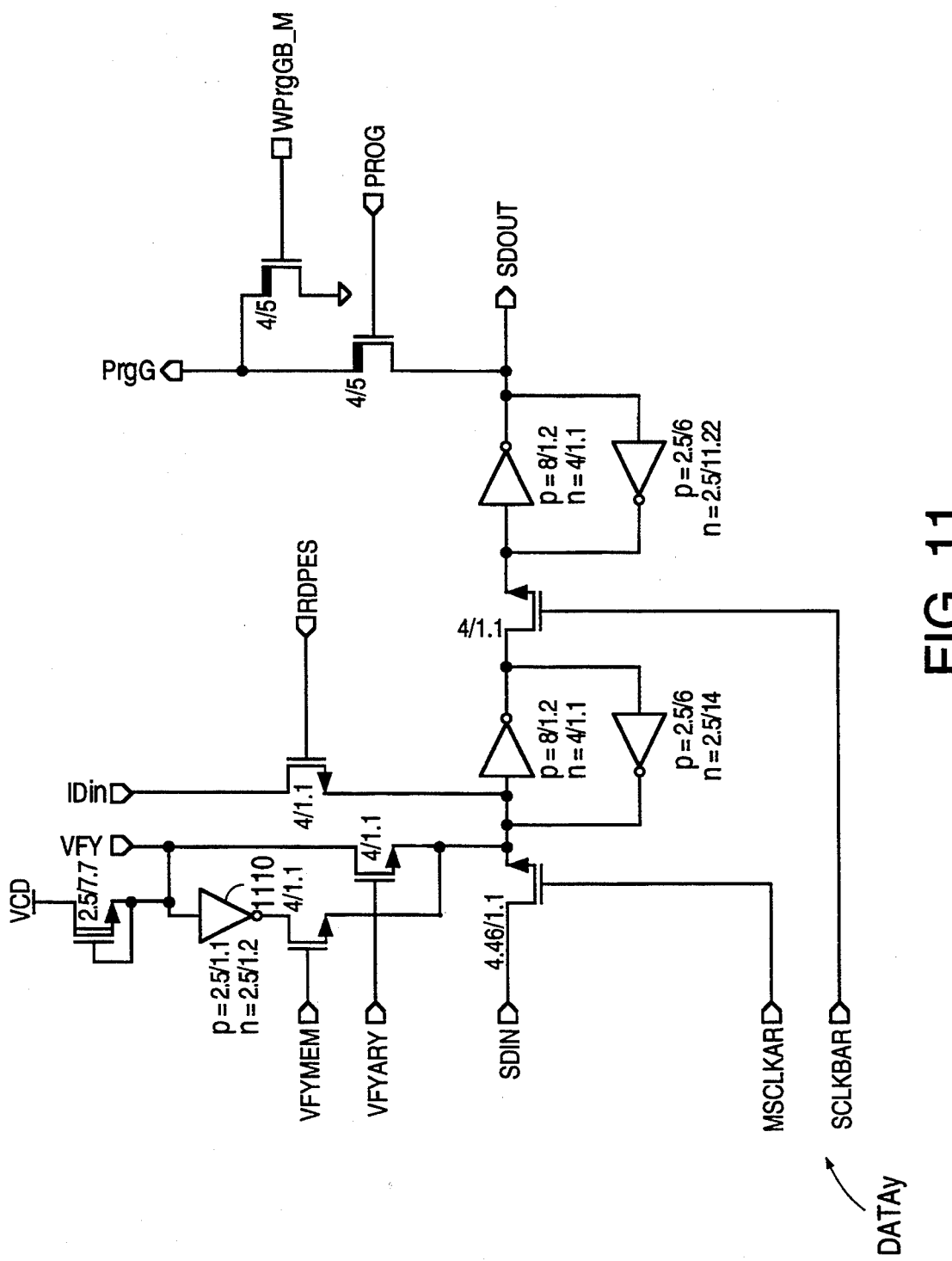

Each SRL DATA0 through DATA15 has a circuit diagram of FIG. 11. When memory 650 and the interconnect cell array 330AR are not being programmed, signal WPrgGB—M is asserted high to ground the output PrgG of each SRL DATAy. The signal WPrgGB—M is asserted high to erase the interconnect cells and the memory.

When the VERIFY command is executed on the interconnect cell array, signal VFYARY is asserted high. When the VERIFY command is executed on memory 650, signal VFYMEM is asserted high. The input signal on terminal VFY is then inverted by inverter 1110 as the memory stores data in the inverse form.

Signal RDPES is driven high to read memory row 650-15 into the SRLs DATAy.

Figure 12:
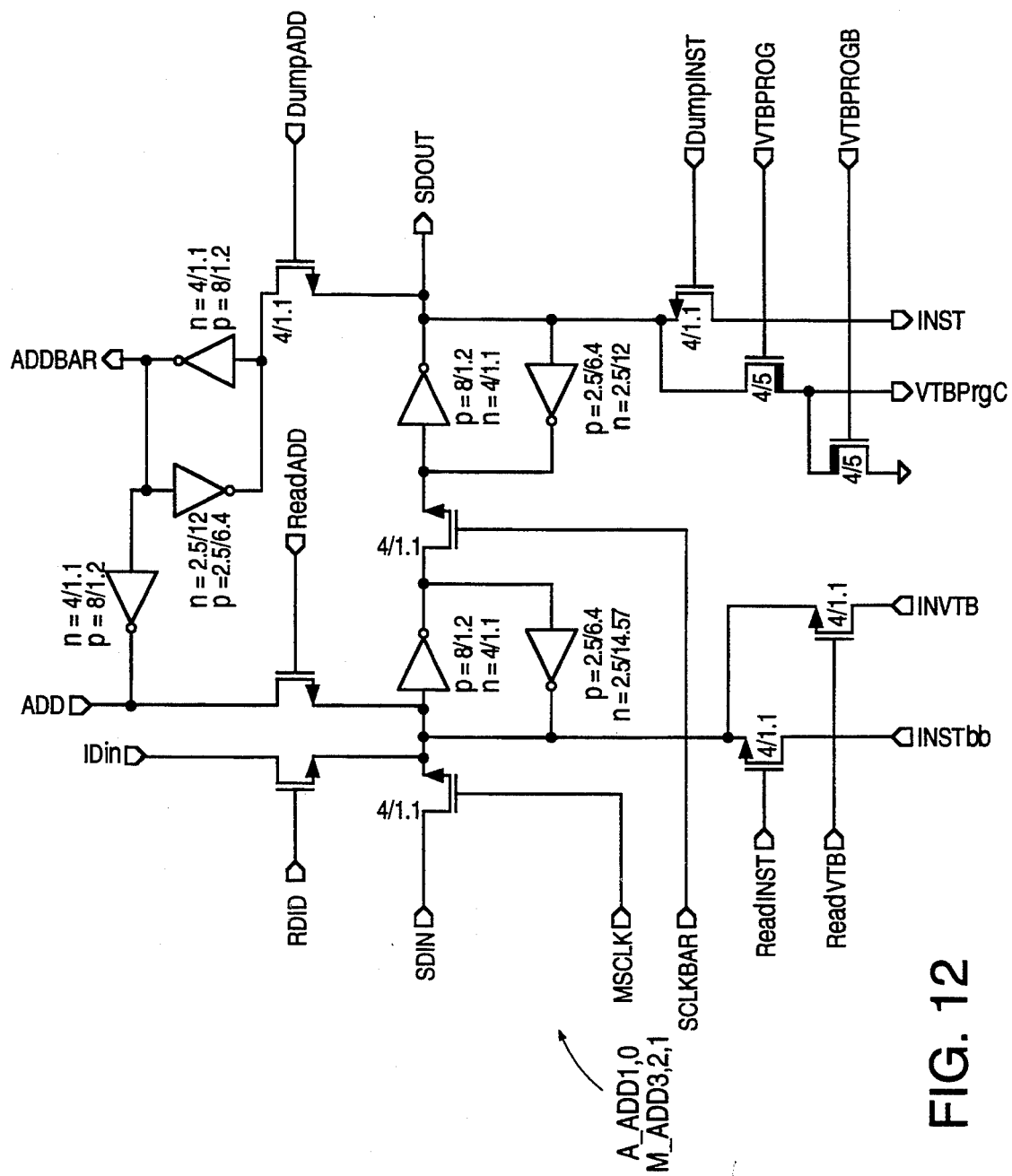

SRLs A_ADD1,0, M_ADD3,2,1 have each a circuit diagram of FIG. 12. These SRLs are clocked by clock MSCLK. Terminals ADD and ADDBAR are connected to row address decoder 642 (FIG. 6). Signal DumpADD is asserted high on transitions from state 2 to state 1 (FIG. 7) to write the row address through the respective terminals ADDBAR to decoder 642. On transitions from state 1 to state 2, signal ReadADD is driven high to transfer the row address through the terminals ADD back into the SRLs.

On transitions from state 1 to state 2, signal DumpINST is asserted high to write the command code to register INST_LATCH (FIG. 6). On transitions from state 2 to state 1, signal ReadINST is asserted high to read the previous command back into the SRLs. The previous command is shifted out through the INSTRUCTION line (FIG. 6) as a new command is shifted in.

In state 0, signal RDID is asserted high to load the ID into the SRLs.

When the register VTB_CONTROL_IDB1,0 is programmed during manufacturing, signal VTBPROG is asserted high to transfer data from the SRLs into the register. At other times, signal VTBPROGB is asserted high so as to ground terminal VTBPrgG and thus to keep this terminal from floating. Signal VTBPROGB is asserted high to erase the five "voltage trim" bits of the register. The voltage trim bits define the VPP value as described above.

During the transition from state 2 to state 1 in manufacturing mode, signal ReadVTB is asserted high to read into the SRLs the five voltage trim bits. These bits are shifted out from the SRLs for verification.

Figure 13:
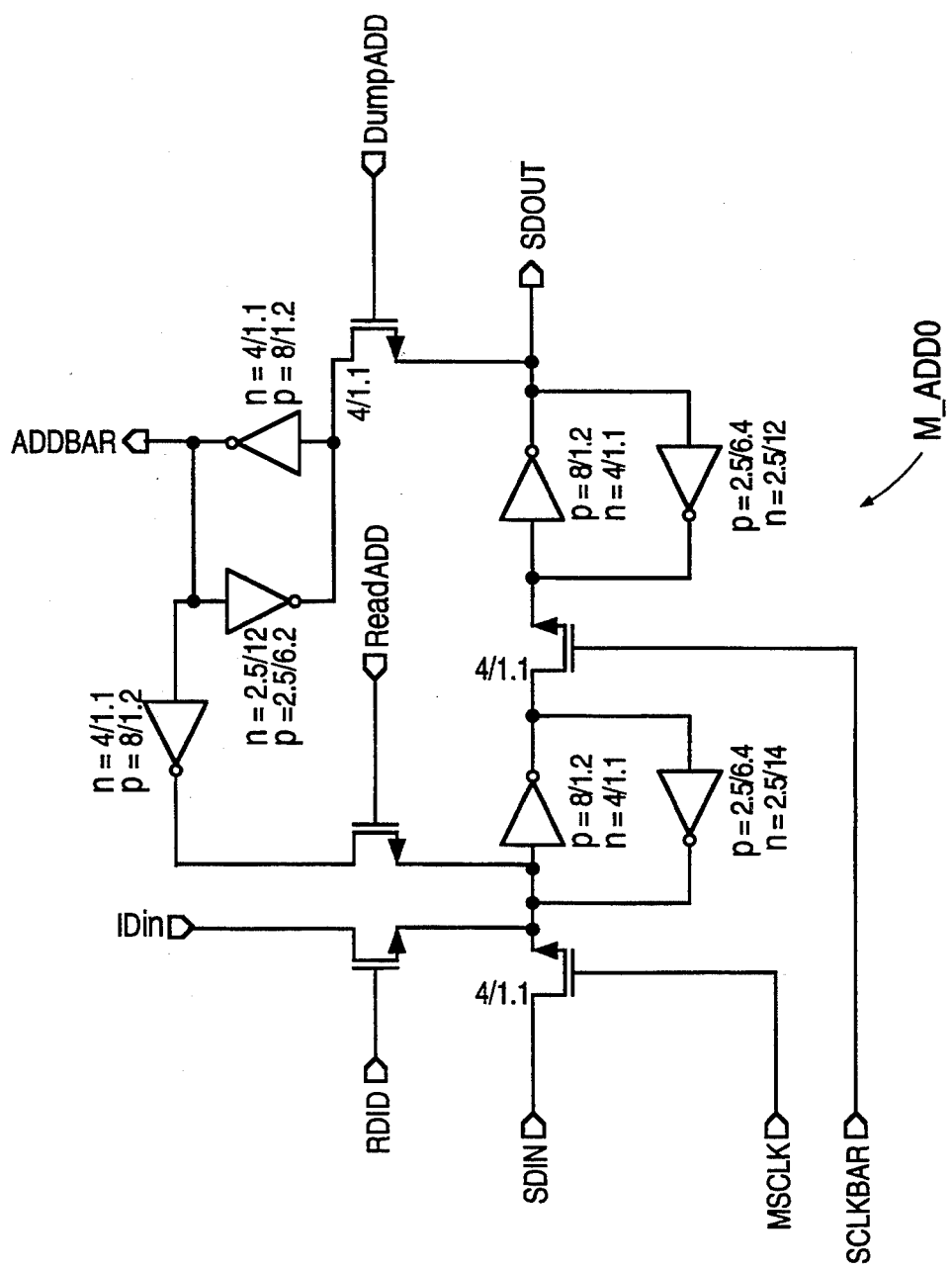

FIG. 13 is a circuit diagram of SRL M_ADD0.

Figure 14:
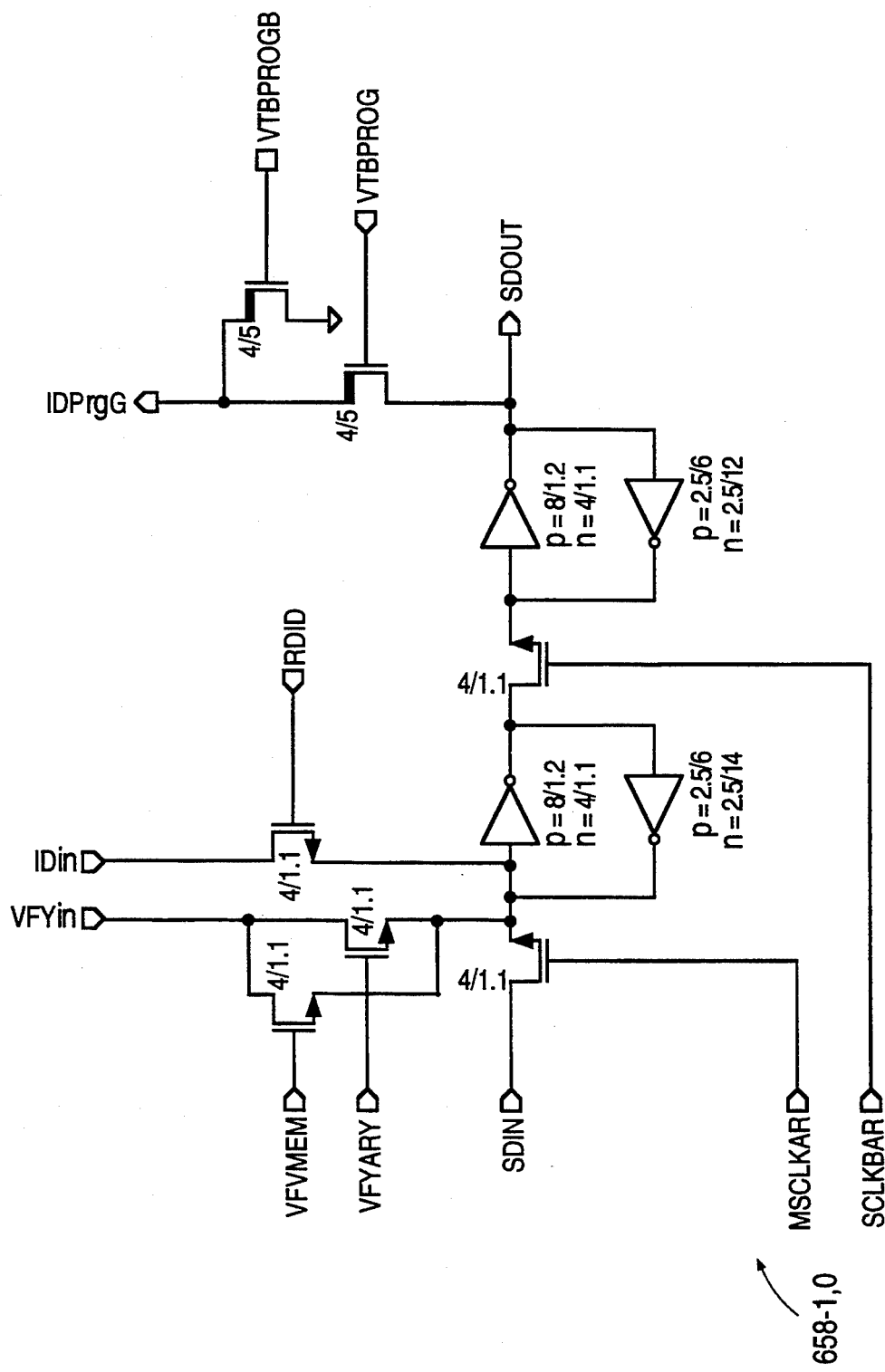

FIG. 14 is a circuit diagram of each of SRLs 658-1,0.

Figure 15:
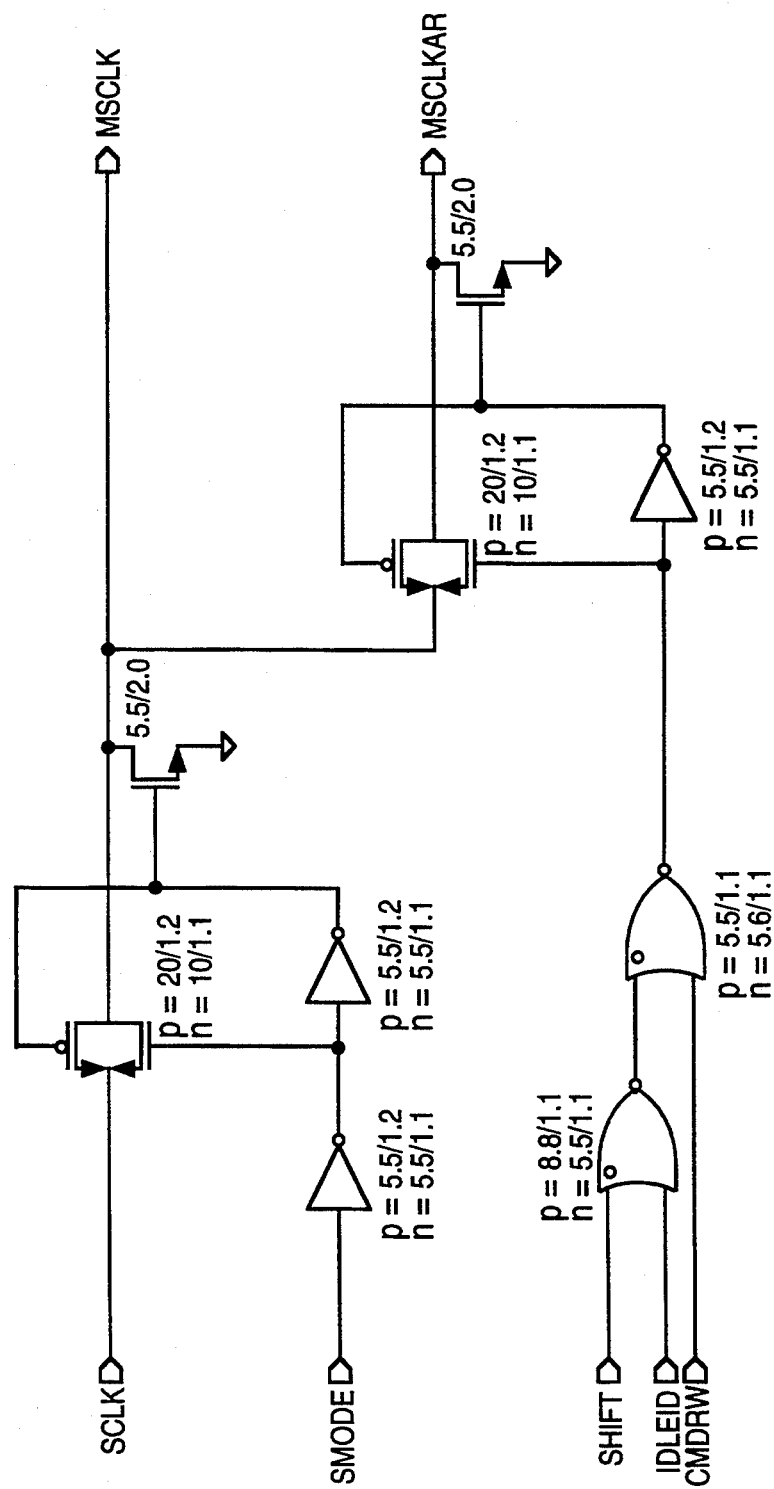
FIG. 15 is a circuit diagram of a circuit generating clock signals in the switch of FIG. 1.

FIG. 15 is a circuit diagram of a circuit generating the clocks MSCLK, MSCLKAR.

Figure 16:
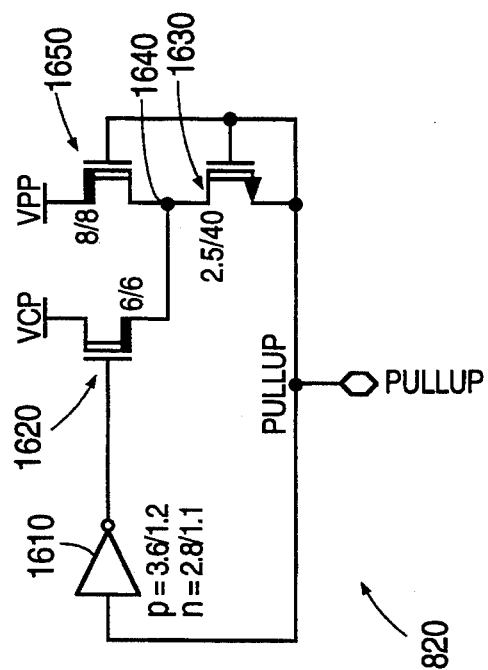
FIG. 16 is a circuit diagram of a high voltage pullup circuit of the switch of FIG. 1.

FIG. 16 is a circuit diagram of the high voltage pullup circuit 820 of FIG. 8. As described above, terminal PULLUP of circuit 820 is connected to output PrgG of the respective SRL L-Ax or L-By (FIG. 8). Voltage VPP is generated by switch 120 internally using charge-pumping techniques known in the art. The VPP value is set by a voltage divider as described above in connection with FIG. 6.

When the SRL L-Ax or L-By pulls the terminal PULLUP to ground, inverter 1610 drives the gate of depletion transistor 1620 to VCC. Transistor 1620 turns on and overcomes the weaker depletion transistor 1630 and drives node 1640 to about VCC. Consequently, the gate of depletion transistor 1650 is at ground, one source/drain electrode of the transistor is at VPP, and the other source/drain electrode is at VCC. Transistor 1650 turns off blocking the current from the weak-current-drive voltage source VPP. (In one embodiment, VCC=5.0 V; VPP=14.5 V; and the threshold voltage of transistor 1650 is between −3 V and −4 V.)

If the respective SRL L-Ax or L-By drives terminal PULLUP to VCC, transistor 1650 turns on pulling the terminal PULLUP up to about VPP.

While the invention has been illustrated with respect to the embodiments described above, other embodiments and variations are within the scope of the invention. In particular, the invention is not limited by the number of pins. Further, the number of pins Ax and the number of pins By need not be equal to each other. The invention is not limited by the transistor or capacitor sizes or by voltage levels. The invention is not limited by CMOS technology, and the invention can be implemented in NMOS, PMOS, bipolar or other technologies. The terms "programmed" and "erased" are interchangeable in that the invention is not limited as to which state of a programmable element or a programmable cell is termed "programmed" and which state is termed "erased". Other embodiments and variations are within the scope of the invention which is defined by the following claims.

What is claimed is:

1. An integrated circuit switch comprising:
   a first plurality of conductive lines;
   a second plurality of conductive lines integrated with the first conductive lines;
   a plurality of pins, each pin being for accessing a corresponding one of said conductive lines of said first and second pluralities from outside the integrated circuit;
   a plurality of programmable interconnect cells integrated with the conductive lines, each interconnect cell for programmably interconnecting one line of said first plurality and one line of said second plurality; and
   a plurality of I/O cells, each I/O cell connected between one of said pins and the conductive line corresponding to the pin, each I/O cell comprising a programmable output section integrated with the conductive lines and having an input connected to the conductive line and an output connected to the pin, the output section being for driving an output signal outside the integrated switch onto the pin, wherein the output section can be programmed to provide on said pin, alternatively, (1) a signal corresponding to the signal on the conductive line or (2) a first predetermined signal independent of the signal on the corresponding conductive line.

2. The switch of claim 1 wherein each line of said first plurality and each line of said second plurality are programmably interconnected by one of said programmable interconnect cells.

3. The switch of claim 1 further comprising:
   means for putting said programmable interconnect cells into a conductive state or a non-conductive state, said means comprising a data store for storing data that define an operation of said means on each said interconnect cell; and
   a first pin for serially entering data into said data store.

4. The switch of claim 3 further comprising a second pin for serially providing data from said data store.

5. The switch of claim 1 wherein each said programmable interconnect cell comprises a non-volatile programmable element whose state defines whether said cell is in a conductive state or in a non-conductive state.

6. The switch of claim 5 wherein each said non-volatile programmable element is reprogrammable.

7. The switch of claim 6 wherein each said non-volatile programmable element comprises a floating gate transistor whose state defines whether the cell comprising the transistor is in a conductive state or in a non-conductive state.

8. The switch of claim 7 wherein:
   each said floating gate transistor comprises:
   a first electrode;

a second electrode; and a floating gate for controlling a conductivity of an electrical path between said first and second electrodes; and each said programmable interconnect cell further comprises:

a transistor having a first electrode connected to a line of said first plurality, a second electrode connected to a line of said second plurality, and a control electrode; and means for connecting said control electrode to one of said first and second electrodes of the floating gate transistor of said interconnect cell.

9. The switch of claim 1 further comprising:
means for receiving a power supply voltage; and
means for generating from said power supply voltage a programming voltage for changing states of said programmable interconnect cells, wherein said programming voltage is greater in magnitude than said power supply voltage.

10. The switch of claim 1 wherein said first predetermined signal is a ground voltage.

11. The switch of claim 1 wherein said first predetermined signal is a predetermined non-zero voltage.

12. The switch of claim 1 wherein each said output section can be programmed to provide on the corresponding pin a second predetermined signal independent of the signal on the corresponding conductive line and different from said first predetermined signal.

13. The switch of claim 12 wherein:
said first predetermined signal is a ground voltage; and
said second predetermined signal is a predetermined non-zero voltage.

14. The switch of claim 1 wherein said output section can be programmed to provide on said pin, alternatively, (1) a signal logically equivalent to a signal on the corresponding conductive line or (2) a signal logically inverse of the signal on the corresponding conductive line.

15. The switch of claim 1 wherein said I/O cell can be programmed, alternatively, to configure the pin as an input pin or an output pin.

16. The switch of claim 15 further comprising:
means for receiving a power supply voltage; and
means for generating from said power supply voltage a programming voltage for programming said I/O cells, wherein said programming voltage is higher in magnitude than said power supply voltage.

17. The switch of claim 1 wherein each output section comprises
an input terminal;
a first variable-impedance means for connecting the corresponding pin to a first voltage, said first variable-impedance means having a higher impedance in a first state of said pin than in a second state of said pin, said first variable-impedance means comprising a first control terminal for controlling the impedance of said first variable-impedance means;
a second variable-impedance means for connecting said pin to a second voltage, said second variable-impedance means having a higher impedance in the second state of said pin than in the first state of said pin, said second variable-impedance means comprising a second control terminal for controlling the impedance of said second variable-impedance means;

means for providing signals on said first and second control terminals in response to a signal on said input terminal; and a feedback path from said second control terminal to said signal-providing means such that said signal-providing means is responsive to the signal on said second control terminal to delay a transition of the signal on said first control terminal during a transition of said pin from the first state to the second state so that the impedance of said second means increases before the impedance of said first means starts decreasing;

wherein said switch further comprises means for connecting said input terminal to a corresponding conductive line.

18. The switch of claim 17 wherein said signal-providing means comprises:
a transistor having a first electrode, a second electrode and a control electrode;
means for connecting said first electrode to said first control terminal; and
means for connecting said second electrode to a voltage;
wherein said feedback path comprises means for connecting said control electrode of said transistor to said second control terminal.

19. The switch of claim 1 wherein at least one output section comprises
a translator having an input connected to the corresponding conductive line and having an output, for translating a signal on the corresponding conductive line into a signal having one of predetermined levels; and
means M1 for connecting the output of said translator to said pin P.

20. The switch of claim 19 wherein said buffer further comprises means M2 for passing signals from said pin P to said line L, wherein said means M2 is connected between said pin P and said line L in parallel with said translator and said means M1.

21. An integrated circuit switch comprising:
a plurality of conductive lines;
means for programmably interconnecting said conductive lines;
a plurality of pins, each pin being for accessing a corresponding one of said conductive lines from outside the switch; and
for each said pin, a programmable I/O cell connected between said pin and the corresponding conductive line, wherein at least one I/O cell comprises a programmable output section integrated with the conductive lines, the output section having an input connected to the corresponding conductive line and an output connected to the corresponding pin, the output section being for driving an output signal outside the integrated switch onto the pin, wherein the output section can be programmed to provide on said pin, alternatively, (1) a signal corresponding to a signal on the corresponding conductive line or (2) a first predetermined signal independent of the signal on the corresponding conductive line.

22. The switch of claim 21 wherein each said output section can be programmed to provide on the corresponding pin a second predetermined signal independent of the signal on the corresponding conductive line and different from said first predetermined signal.

23. The integrated switch of claim 22 wherein the output section can be programmed to provide on the pin, alternatively, (1) a signal logically equivalent to the signal on the corresponding conductive line or (2) a signal logically inverse of the signal on the corresponding conductive line.

24. The integrated switch of claim 23 wherein the output section comprises:
- a first programmable section for receiving a signal from the corresponding conductive line, wherein the first section can be programmed, alternatively, to provide (1) a signal corresponding to the signal on the corresponding conductive line, or (2) a third predetermined signal; and
- a polarity selection section which can be programmed, alternatively, to invert or not to invert the signal provided by the first section.

25. The integrated switch of claim 23 further comprising one or more non-volatile programmable and reprogrammable elements for programming the output section.

26. A method for providing one or more electrical paths through an integrated circuit switch, the method comprising the steps of:
- programming one or more interconnect cells in the integrated switch to interconnect selectively sets of conductive lines in the integrated switch;
- programming a plurality of I/O cells in the integrated switch, each I/O cell interconnecting one of the conductive lines and a corresponding pin of the integrated switch, one or more of the I/O cells comprising each an output section which can be programmed alternatively to drive onto the corresponding pin (1) a signal corresponding to the signal on the corresponding conductive line or (2) a first predetermined signal independent of the signal on the corresponding conductive line, the step of programming the I/O cells comprising programming one or more of the output sections, wherein the pins, the conductive lines, the interconnect cells and the output sections provide the one or more electrical paths.

27. The method of claim 26 wherein each output section can be programmed to provide on the corresponding pin alternatively (1) a signal logically equivalent to the signal on the corresponding conductive line or (2) a signal logically inverse of the signal on the corresponding conductive line.

28. An integrated circuit switch comprising:
- a plurality of conductive lines;
- a plurality of programmable interconnect cells each of which programmably interconnects two of the conductive lines;
- a plurality of pins for accessing the conductive lines from outside the switch; and
- a plurality of programmable I/O cells integrated in the switch, each I/O cell interconnecting one of the pins and one of the conductive lines, each I/O cell comprising:
  - an output section having an input connected to the corresponding conductive line and an output connected to the corresponding pin, for driving a digital signal outside the switch onto the corresponding pin, the digital signal having one or more discrete levels; and
  - a transistor connected between the corresponding pin and the corresponding conductive line for passing signals between the pin and the conductive line;
  - wherein the I/O cell can be programmed alternatively (1) to turn off the transistor and to enable the output section to drive a digital signal onto the corresponding pin, or (2) to turn on the transistor and to disable the output section from driving a digital signal onto the corresponding pin.

29. A method for providing one or more electrical paths through an integrated switch, the method comprising the steps of:
- programming one or more interconnect cells in the integrated switch to interconnect selectively sets of conductive lines in the integrated circuit;
- programming a plurality of I/O cells in the integrated switch, each I/O cell interconnecting one of the conductive lines and a corresponding pin of the integrated circuit, each I/O cell comprising:
  - an output section having an input connected to the conductive line and an output connected to the pin, for driving a digital signal outside the integrated switch onto the pin, the digital signal having one or more discrete levels; and
  - a transistor connected between the pin and the conductive line;
  - wherein the step of programming the I/O cells comprises programming each I/O cell either (1) to turn off the corresponding transistor and to enable the corresponding output section to drive a digital signal onto the corresponding pin, or (2) to turn on the corresponding transistor and to disable the corresponding output section from driving a signal onto the corresponding pin.

30. An integrated circuit switch comprising:
- a plurality of conductive lines;
- a plurality of programmable interconnect cells each of which programmably interconnects two of the conductive lines;
- a plurality of pins for accessing the conductive lines from outside the switch; and
- for each pin, an output section for driving the pin, the output section comprising:
  - an input terminal connected to one of the conductive lines;
  - a first variable-impedance means for connecting said pin to a first voltage, said first variable-impedance means having a higher impedance in a first state of said pin than in a second state of said pin, said first variable-impedance means comprising a first control terminal for controlling the impedance of said first variable-impedance means;
  - a second variable-impedance means for connecting said pin to a second voltage, said second variable-impedance means having a higher impedance in the second state of said pin than in the first state of said pin, said second variable-impedance means comprising a second control terminal for controlling the impedance of said second variable-impedance means;
  - means for providing signals on said first and second control terminals in response to a signal on said input terminal; and
  - a feedback path from said second control terminal to said signal-providing means such that said signal-providing means is responsive to the signal on said second control terminal to delay a transition of the signal on said first control terminal during a transition of said pin from the first state to the second state so that the impedance of said second means increases before the impedance of said first means starts decreasing.

31. The switch of claim 30 wherein said signal-providing means comprises:
a transistor having a first electrode, a second electrode and a control electrode;
means for connecting said first electrode to said first control terminal; and
means for connecting said second electrode to a voltage;
wherein said feedback path comprises means for connecting said control electrode of said transistor to said second control terminal.

32. A method for driving a pin of an integrated circuit switch, the method comprising the steps of:
connecting the pin to a first voltage by a first variable-impedance means having a higher impedance in a first state of the pin than in a second state of the pin, the first variable-impedance means comprising a first control terminal for controlling the impedance of the first variable-impedance means;
connecting the pin to a second voltage by a second variable-impedance means having a higher impedance in the second state of the pin than in the first state of the pin, the second variable-impedance means comprising a second control terminal for controlling the impedance of the second variable-impedance means;
providing signals on the first and second control terminals in response to a signal on one of the conductive lines of the integrated circuit switch so as to delay a transition of the signal on the first control terminal in response to the signal on the second control terminal during a transition of the pin from the first state to the second state so as to increase the impedance of the second means before the impedance of the first means start decreasing.

33. An integrated circuit switch comprising:
a plurality of conductive lines;
a plurality of programmable interconnect cells each of which programmably interconnects two of the conductive lines;
a plurality of pins for accessing the conductive lines from outside the switch; and
a plurality of programmable I/O cells integrated in the switch, each I/O cell interconnecting one of the pins and one of the conductive lines, each I/O cell comprising:
an output section for driving an output signal outside the switch onto the corresponding pin, the output section comprising:
a translator having an input connected to the corresponding conductive line and having an output, for translating a signal on the corresponding conductive line into a signal having one of predetermined levels;
means for connecting the translator to a source of power to provide power to the signal having one of the predetermined levels; and
means for connecting the output of the translator to the corresponding pin;
the I/O cell further comprising a transistor interconnecting the pin and the conductive line in parallel with the output section,
wherein the I/O cell can be programmed alternatively (1) to turn off the transistor and to enable the output section to drive an output signal, or (2) to turn on the transistor and to disable the output section from driving an output signal.

34. A method for providing an electrical path through an integrated switch which switch comprises:
a plurality of conductive lines;
at least one interconnect cell which programmably interconnects two of the conductive lines;
a plurality of pins for accessing the conductive lines from outside the switch; and
a plurality of programmable I/O cells integrated in the switch, each I/O cell interconnecting one of the pins and one of the conductive lines, each I/O cell comprising:
an output section for driving a signal outside the switch onto the corresponding pin, the output section comprising:
a translator having an input connected to the corresponding conductive line and having an output, for translating a signal on the corresponding conductive line into a signal having one of predetermined levels, the translator being connected to a source of power to provide power to the signal having one of the predetermined levels; and
means for connecting the output of the translator to the corresponding pin;
the I/O cell further comprising a transistor interconnecting the pin and the conductive line in parallel with the output section,
wherein the method comprises the steps of:
programming one of the interconnect cells to provide a conductive path between a first one of the conductive lines and a second one of the conductive lines;
programming the I/O cell which interconnects the first conductive line and a first one of the pins, so as (1) to turn on the transistor of the I/O cell to enable the transistor to conduct input signals from the first pin to the first conductive line and (2) to turn off the output section of the I/O cell to disable the output section from driving a signal onto the first pin; and
programming the I/O cell interconnecting the second conductive line and a second one of the pins, so as (1) to turn off the transistor of the I/O cell to disable the transistor from conducting input signals from the second pin to the second conductive line and (2) to enable the output section of the I/O cell so as to enable the translator of the output section to translate a signal on the second conductive line.

* * * * *